United States Patent
Tsuji

(10) Patent No.: US 6,778,434 B2
(45) Date of Patent: Aug. 17, 2004

(54) MAGNETIC RANDOM ACCESS MEMORY DEVICE WITH A REDUCED NUMBER OF INTERCONNECTIONS FOR SELECTION OF ADDRESS

(75) Inventor: Takaharu Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/461,429

(22) Filed: Jun. 16, 2003

(65) Prior Publication Data
US 2004/0125650 A1 Jul. 1, 2004

(30) Foreign Application Priority Data
Dec. 25, 2002 (JP) ..................................... 2002-374254

(51) Int. Cl.[7] ............................................. G11C 11/15
(52) U.S. Cl. ...................... 365/173; 365/158; 365/171; 365/230.03; 365/230.06
(58) Field of Search ................................ 365/173, 158, 365/171, 230.03, 230.06, 230.07

(56) References Cited

U.S. PATENT DOCUMENTS

| | | |
|---|---|---|
| 6,272,041 B1 | 8/2001 | Naji |
| 6,509,621 B2 * | 1/2003 | Nakao .......................... 257/421 |
| 6,618,317 B1 | 9/2003 | Tsuji et al. |
| 2003/0174536 A1 * | 9/2003 | Hidaka ......................... 365/158 |
| 2003/0214862 A1 * | 11/2003 | Asao et al. ................... 365/200 |

FOREIGN PATENT DOCUMENTS

JP     2002-175688     6/2002

* cited by examiner

*Primary Examiner*—Richard Elms
*Assistant Examiner*—Toan Le
(74) *Attorney, Agent, or Firm*—McDermott Will & Emery LLP

(57) ABSTRACT

Each memory cell row is associated with access transistors having their source regions electrically connected together by an $n^+$ diffusion node extending in the direction of the row. The $n^+$ diffusion node is connected to a main word line set to have the low level (a ground voltage) in selecting a corresponding memory cell row. When the main word line is set low, responsively in a data read operation a selected row's word line is set high and in a data write operation a selected row's digit line is set high.

20 Claims, 18 Drawing Sheets

MAGNETIC RANDOM ACCESS MEMORY DEVICE WITH A REDUCED NUMBER OF INTERCONNECTIONS FOR SELECTION OF ADDRESS

BACKGROUND OF THE INVENTION

1. Field of the Invention

The present invention relates generally to magnetic random access memory devices and particularly to those including memory cells having magnetic tunneling junctions (MTJs) (hereinafter also referred to as "MTJ memory cells").

2. Description of the Background Art

A magnetic random access memory (MRAM) device includes as a memory device a device having a tunneling magneto-resistive (TMR) effect (hereinafter referred to as a "tunneling magneto-resistance element"). The tunneling magneto-resistance element has a magnetic tunnel junction structure and is formed of a first thin magnetic film providing a fixed direction of magnetization, a second thin magnetic film providing a direction of magnetization rewritable by a magnetic field externally applied, and a tunnel insulating film sandwiched between the first and second thin magnetic films.

A tunneling magneto-resistance element with the first and second thin magnetic films' magnetic moments parallel and anti-parallel in direction provides resistance having a minimum value Rmin and a maximum value Rmax, respectively. As such when the tunneling magneto-resistance element is used in an MTJ memory cell its magnetic moments' parallel and anti-parallel states are correlated to one and the other of storage data's logic levels "0" and "1", respectively. The MTJ memory cell stores data, holding it in non-volatile manner until it is rewritten by a data writing magnetic field applied capable of inverting a direction of magnetization in the thin magnetic film that exceeds a threshold level.

Generally an MRAM device includes a digit line and a word line provided to correspond to a row of MTJ memory cells and corresponding to a write select line and a read select line, respectively, and a bit line corresponding to a data line provided to correspond to a column of MTJ memory cells to achieve random access. Thus MTJ memory cells are arranged to correspond to intersections of bit and digit lines.

In a data write a data write current is supplied to digit and bit lines, as addressed, selectively. Furthermore, designing so that a magnetic field acting on an MTJ memory cells when a data write current flows through both of corresponding digit and bit lines exceeds the aforementioned threshold level, allows digital data to be written to an MTJ memory cell having its address selected.

In a data read a word line is selected and responsively a selected MTJ memory cell's TMR device is electrically connected between a corresponding bit line and a source line, and the bit line and the source line are provided with a difference in potential to generate a current passing through the MTJ memory cell. The current is detected and data stored in the selected memory cell is read.

The MRAM device with the MTJ memory cell described above is noted as a rapidly, randomly accessible, non-volatile memory device. As compared with dynamic random access memory (DRAM), however, the MR device excessively requires a metal interconnection corresponding to the digit line described above.

In general, an MRAM device's chip fabrication cost is proportional to the number of process steps, and increased numbers of metal interconnection layers required contribute to increased chip fabrication cost. Furthermore in embedding an MRAM device together with a logic chip if the number of metal interconnection layers required for the logic portion is larger than that of metal interconnection layers required for an MTJ memory cell the use of the MRAM device as an embedded memory would provide increased fabrication cost.

Accordingly the number of interconnection layers in an MRAM device is reduced by providing a low ohmic connecting of a programming line corresponding to the aforementioned digit line and a word line together to eliminate a metal interconnection arranged to correspond to a column of memory cells, for example as disclosed in Japanese Patent Laying-Open No. 2002-175688.

The conventional configuration sharing digit and word lines, as disclosed in the publication, however, requires control so that in a data read the digit line do not have a current passing therethrough. This would require a transistor switch not only at one end of the digit line but opposite ends thereof. Furthermore in a data write as the digit line is supplied with a current the word line's potential also simultaneously increases and accordingly it is necessary to increase an access transistor's source potential to decrease a leak current in a non-selected memory cell. More specifically, a source line voltage control circuit is additionally required. As such, while the conventional configuration does provide a reduced number of interconnection layers, it requires an additional control circuit resulting in an increased circuit area.

When a memory device is increased in capacity, a configuration dividing a memory cell array into a plurality of subarrays to allow hierarchical address selection is adopted to reduce signal propagation delay. (Hereinafter this configuration will also be referred to as a "divided array configuration.")

The divided array configuration, however, requires a hierarchical address select line. This results in a further increased number of metal interconnection layers required and hence increased chip fabrication cost. The divided array configuration may be provided with an address decoder arranged locally for each subarray. While this does avoid increased numbers of metal interconnection layers, the provision of multiple address decoders contributes to an increased chip area.

SUMMARY OF THE INVENTION

The present invention contemplates a magnetic random access memory device allowing a divided array configuration and the like to have reduced numbers of interconnection layers required for an address select line without increased chip areas.

The present invention provides a magnetic random access memory device comprised of: a memory cell array including a plurality of magnetic memory cells arranged in rows and columns, the memory cell array being divided into a plurality of subarrays arranged in rows and columns; and a plurality of global select lines provided to correspond to one of the rows and the columns of the plurality of magnetic memory cells commonly for the subarrays sharing one of the rows and the columns of the plurality of magnetic memory cells. The plurality of global select lines in each of data read and write operations is each set to a voltage corresponding to selection and non-selection of one corresponding thereto.

The plurality of subarrays each include a plurality of bit lines provided to correspond to the plurality of magnetic columns, a plurality of select lines provided to correspond to one of the rows and the columns of the plurality of magnetic memory cells for selecting one of the rows and the columns of the plurality of magnetic memory cells in the subarray corresponding thereto, and a plurality of select line drivers provided to correspond to the plurality of select lines, respectively, to each drive a voltage of a corresponding one of the select lines in response to the voltage of a corresponding one of the global select lines. The plurality of magnetic memory cells each have a magneto-resistance element electrically connected to a corresponding one of the bit lines, and an access element electrically connected between the magneto-resistance element and one of the plurality of global select lines and the access element in the data read operation turns on or off in response to a result of a row select operation in a corresponding one of the subarrays, the access element in the data write operation is turned off regardless of the result.

A main advantage of the present invention is that in a magnetic random access memory device including a memory cell array divided into a plurality of subarrays to provide hierarchical address selection a consideration is provided not to impair address selection and in addition thereto a global select line can electrically be connected to an access element to eliminate an interconnection (a source line) arranged to correspond to the access element. As a result a reduced number of metal interconnection layers and hence a reduced fabrication cost can be provided.

The present invention in another configuration provides a magnetic random access memory device comprised of: a plurality of magnetic memory cells arranged in rows and columns; a plurality of data lines arranged to correspond to the columns of the plurality of magnetic memory cells; a plurality of data line select lines provided to correspond to the columns; and a plurality of row select lines provided to correspond to the rows of the plurality of magnetic memory cells, the plurality of magnetic memory cells each having a magneto-resistance element electrically connected to a corresponding one of the bit lines, and an access element electrically connected between the magneto-resistance element and one of the plurality of data line select lines, the access element in the data read operation turning on or off in response to a result of selecting a corresponding one of the rows, the access element in the data write operation being turned off regardless of the result.

In such a magnetic random access memory device when an access element turns on/off in response to a result of a row select operation a consideration can be given not to impair address selection and a select line indicating a result of a column select operation can electrically be connected to the access element to eliminate an interconnection (a source line) arranged to correspond to the access element. Consequently, whether or not address selection is hierarchical, a reduced number of metal interconnection layers and hence a reduced fabrication cost can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
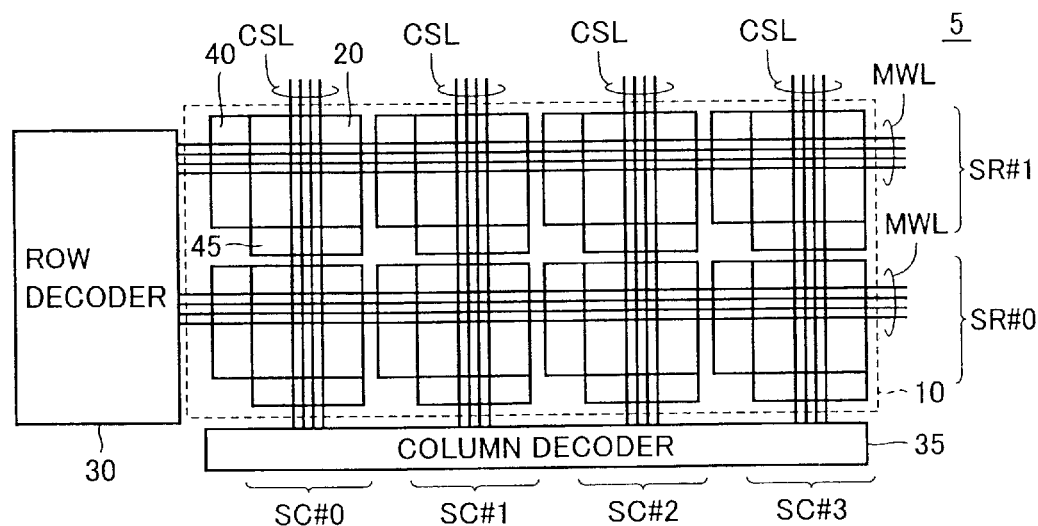
FIG. 1 is a block diagram showing a general configuration of an MRAM device having a divided array configuration.

Hereinafter, the present invention in embodiments will be described with reference to the drawings more specifically. In the figures, like reference characters denote like components.

First Embodiment

Divided Array Configuration

Initially before a configuration in a first embodiment is described a general configuration of an MRAM device having a divided array configuration in which increased numbers of interconnection layers are an issue to be particularly addressed and a conventional address select configuration are described with reference to FIGS. 1–7.

With reference to FIG. 1, an MRAM device 5 having a divided array configuration includes a memory cell array 10 having a plurality of MTJ memory cells arranged in rows and columns, a row decoder 30 and a column decoder 35. Memory cell array 10 is divided into a plurality of subarrays 20 aligned in rows and columns. In FIG. 1, memory cell array 10 is divided into two rows of subarrays SR#0, SR#1 and four columns of subarrays SC#0 to SC#3, 2×4 subarrays 20 in total. For each subarray 20 a row select portion and a column select portion 45 are provided for selecting a row and a column in the subarray.

Hereinafter a row of MJ memory cells and a column of MJ memory cells will be referred to as a "memory cell row" and a "memory cell column", respectively, and a row of subarrays and a column of subarrays will be referred to as a "subarray row" and a "subarray column", respectively.

Row decoder 30 selects a row in memory cell array 10 via a main word line MWL. Main word line MWL is provided as a global select line involved in a row select operation. It is provided to correspond to a memory cell row and shared by subarrays 20 belonging to a single subarray row. Main word line MWL that has been precharged to a logic low level is set to a logical high level or activated in each of data read and write operations in a selected row. In accordance with main word line MWL row select portion 40 selects a row in the corresponding subarray 20.

Hereinafter in the present specification a configuration in which main word line MWL is arranged for each memory cell row, i.e., a configuration in which in each subarray, main word line MWL and a word line are correlated in a one to one relationship will be described. However, a similar configuration may also be applied to a configuration in which in each subarray, main word line MWL and a word line are correlated in a one to n relationship, wherein n is an integer no less than two, although this configuration requires that each subarray's row select portion 40 be provided with a configuration for effecting the above-described one to n selection.

Column decoder 35 selects a column in memory cell array 10 via a column select line CSL. Column select line CSL is provided to correspond to a memory cell column and shared among subarrays 20 corresponding to a single subarray column. Column select line CSL that has been precharged to attain the low level is set high or activated in each of data read and write operations in a selected column. In accordance with column select line CSL column select portion 45 selects a column in the corresponding subarray 20.

Note that in the exemplary configuration shown in FIG. 1 a column is not selected hierarchically. As such, it is not necessary to provide each subarray with an additional interconnection for selecting a row. In contrast, a row is selected hierarchically and, as will be described hereinafter, word and digit lines, required to reflect a result of the row select operation, are provided for each subarray 20 independently.

Figure 2:
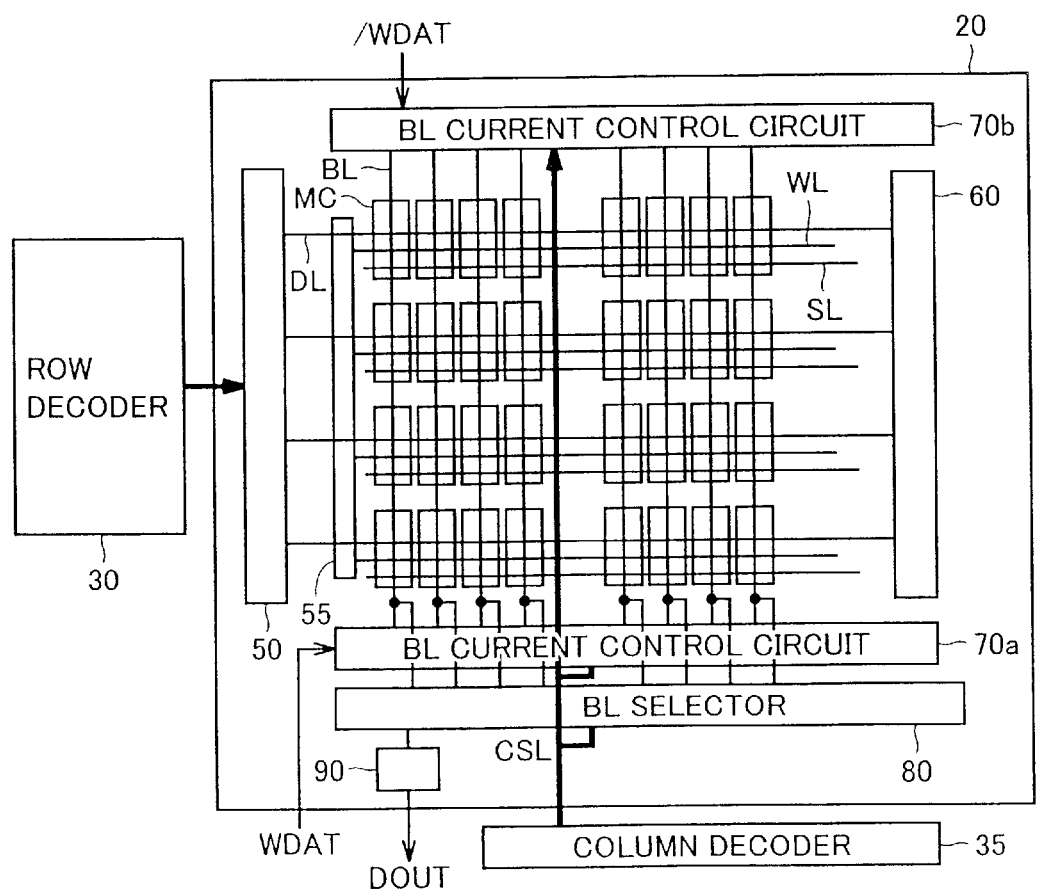
FIG. 2 is a block diagram showing a configuration of a subarray shown in FIG. 1.

FIG. 2 is a block diagram showing a configuration of subarray 20 shown in FIG. 1.

As shown in the figure, subarray 20 includes a plurality of MTJ memory cells MCs arranged in rows and columns, a digit line drive circuit 50, a word line drive circuit 55, a digit line current control portion 60, a bit line (BL) current control circuits 70a, 70b, a bit line (BL) selector 80 and a read amplifier 90. Digit line drive circuit 50 and word line drive circuit 55 correspond to row select portion 40 shown in FIG. 1, and BL current control circuits 70a, 70b and BL selector 80 correspond to column select portion 45 shown in FIG. 1.

As can be understood from the FIG. 1 configuration, the plurality of subarrays 20 belonging to a single subarray row share a memory cell row, while word line WL and digit line DL and source line SL are arranged at each subarray 20 independently, corresponding to a memory cell row. Similarly, the plurality of subarrays 20 belonging to a single subarray column share a memory cell column, while bit line BL is arranged at each subarray 20 independently, corresponding to a memory cell column.

Figure 3:
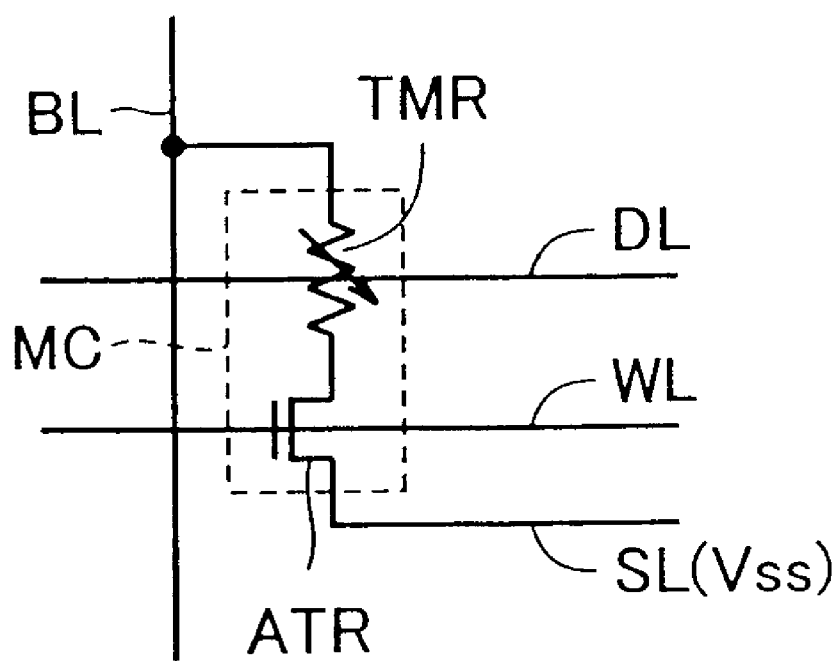
FIG. 3 is a circuit diagram showing a configuration of an MTJ memory cell.

FIG. 3 is a circuit diagram showing a configuration of MTJ memory cell MC.

With reference to FIG. 3, MTJ memory cell MC includes a tunneling magneto-resistance element TMR connected to bit line BL, and an access transistor ATR connected between tunneling magneto-resistance element TMR and source line SL. Access transistor ATR, used as an access element, is representatively an n-MOS transistor and its gate is connected to a corresponding word line WL. Source line SL is coupled with a ground voltage Vss. As has been described previously, tunneling magneto-resistance element TMR provides resistance driven by a level of written, stored data to attain Rmax or Rmin.

As will be described hereinafter more specifically, data is written to an MTJ memory cell by supplying both of corresponding digit and bit lines DL and BL with a data write current. Furthermore in a data read operation a corresponding word line WL is activated to turn on access transistor ATR and bit line BL and source line SL is provided with a difference in potential therebetween to generate a passing current reflecting MTJ memory cell MC's resistance (i.e., stored data).

Referring again to FIG. 2, digit line drive circuit 50 drives one end of digit line DL to a voltage corresponding to a result of a row select operation that is indicated by row decoder 30. Digit line current control portion 60 connects the other end of digit line DL to a fixed voltage (e.g., ground voltage Vss) regardless of the result of address selection of interest. Word line drive circuit 55 drives word line WL to a voltage corresponding to a result of a row select operation that is indicated by row decoder 30.

Bit line current control circuits 70a and 70b in a data write operation drive voltages of opposite ends of bit line BL in response to a result of a column select operation as indicated by column decoder 30 and write data WDAT and /WDAT (an inverted level of WDAT). Bit line selector 80 in a date read operation connects a selected column's bit line BL to read amplifier 90 based on a result of a column select operation as indicated by column decoder 35 to operate. Read amplifier 90 generates data DOUT read from a selected memory cell in accordance with a current passing through the selected column's bit line BL.

From row decoder 30 to digit and word line drive circuits 50 and 55 a result of a row select operation is transmitted by main word line MWL shown in FIG. 1. In contrast, from column decoder 35 to bit line current control circuits 70a, 70b and bit line selector 80 a result of a column select operation is transmitted by column select line CSL.

An address select configuration at each subarray as conventional will now be described.

Figure 4:
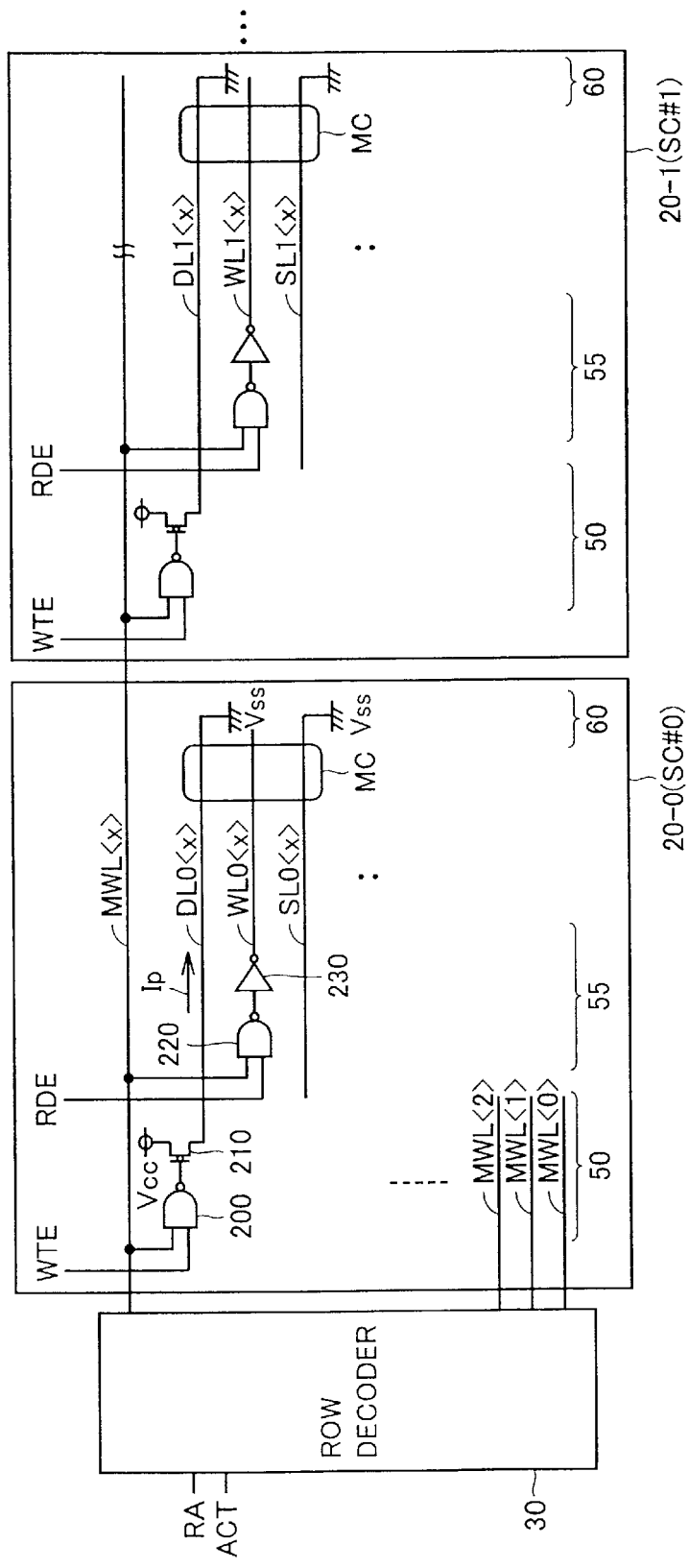
FIG. 4 is a block diagram showing a row select configuration in each subarray.

FIG. 4 is a block diagram showing a row select configuration in each subarray.

FIG. 4 representatively shows a row select configuration corresponding to an xth row in subarrays 20-0 and 20-1 belonging to subarray columns SC#0 and SC#1, respectively, of subarrays 20 belonging to a single, representatively shown subarray row, wherein x represents a natural number. Although not shown specifically, the same row select configuration is arranged in each subarray to correspond to each memory cell row.

Main word line MWL is provided to correspond to each memory cell row and shared among the plurality of subarrays 20 belonging to a single subarray row. In subarray 20-0 a digit line DL0<x>, a word line WL<x> and a source line SL0<x> are arranged to correspond to the xth row. Similarly in subarray 20-1 a digit line DL1<x>, a word line WL1<x> and a source line SL1<x> are arranged to correspond to the xth row. Although not shown in the figure, MTJ memory cell MC, digit line DL, word line WL and source line SL are connected as shown in FIG. 2.

Digit line drive circuit 50 has a logic gate 200 and a driver transistor 210 provided to correspond to each memory cell row. Logic gate 200 outputs an NAND of a control signal WTE and a level in voltage of main word line MWL<x> of the xth row. Control signal WTE is set high or activated in a data write period and otherwise set low or inactivated.

Hereinafter in the present specification data are read and written in each subarray 20 in parallel for the sake of illustration. Accordingly, each subarray receives common control signals WTE, RDE. Note that data read and write operations accompanied with selecting a subarray 20 can be achieved simply by setting control signals WTE, RDE for each subarray row and column independently.

As has been described previously, word line MWL<x> that has been precharged to have the low level (e.g., ground voltage Vss) is set high or activated in each of data read and write operations in selecting the xth row.

Driver transistor 210 is a p-MOS transistor and it is connected between a power supply voltage Vcc and one end of digit line DL0<x> corresponding thereto. Driver transistor 210 has its gate receiving a signal output from logic gate 200. Subarray 20-1 is also similarly configured.

In each subarray each digit line DL has the other end connected to ground voltage Vss in a region corresponding to digit line current control portion 60 shown in FIG. 2, whichever row may have been selected. As such, the representatively shown digit lines DL0<x> and DL1<x> also have the other end connected to ground voltage Vss.

As such in each subarray digit line DL corresponding to a selected row has a data write current Ip flowing therethrough in one direction from digit line drive circuit 50 toward digit line current control portion 60 in response to a corresponding driver transistor 210 turning on.

Word line drive circuit 55 includes a logic gate 220 and a drive inverter 230 provided to correspond to each memory cell row. Logic gate 220 outputs an NAND of control signal RDE and main word line MWL<x>. Drive inverter 230 drives a corresponding word line WL0<x> by an inverted level of a signal output from logic gate 220. Control signal RDE is set high or activated in a data read period and otherwise set low or inactivated.

As such in the data read operation in each subarray word line WL of a selected row is set high or activated in response to a corresponding logic gate 220 outputting the low level. In contrast, each word line WL in a period other than the data read period and word line WL of a non-selected row in the data read period are set low or inactivated.

Furthermore as well as source lines SL0<x>, SL1<x> each source line SL is connected to ground voltage Vss to fix the voltage of the source of access transistor ATR.

Thus main word line MWL shared among a plurality of subarrays 20 and word and digit lines WL and DL provided for each subarray allow a hierarchical row select operation.

Figure 5:
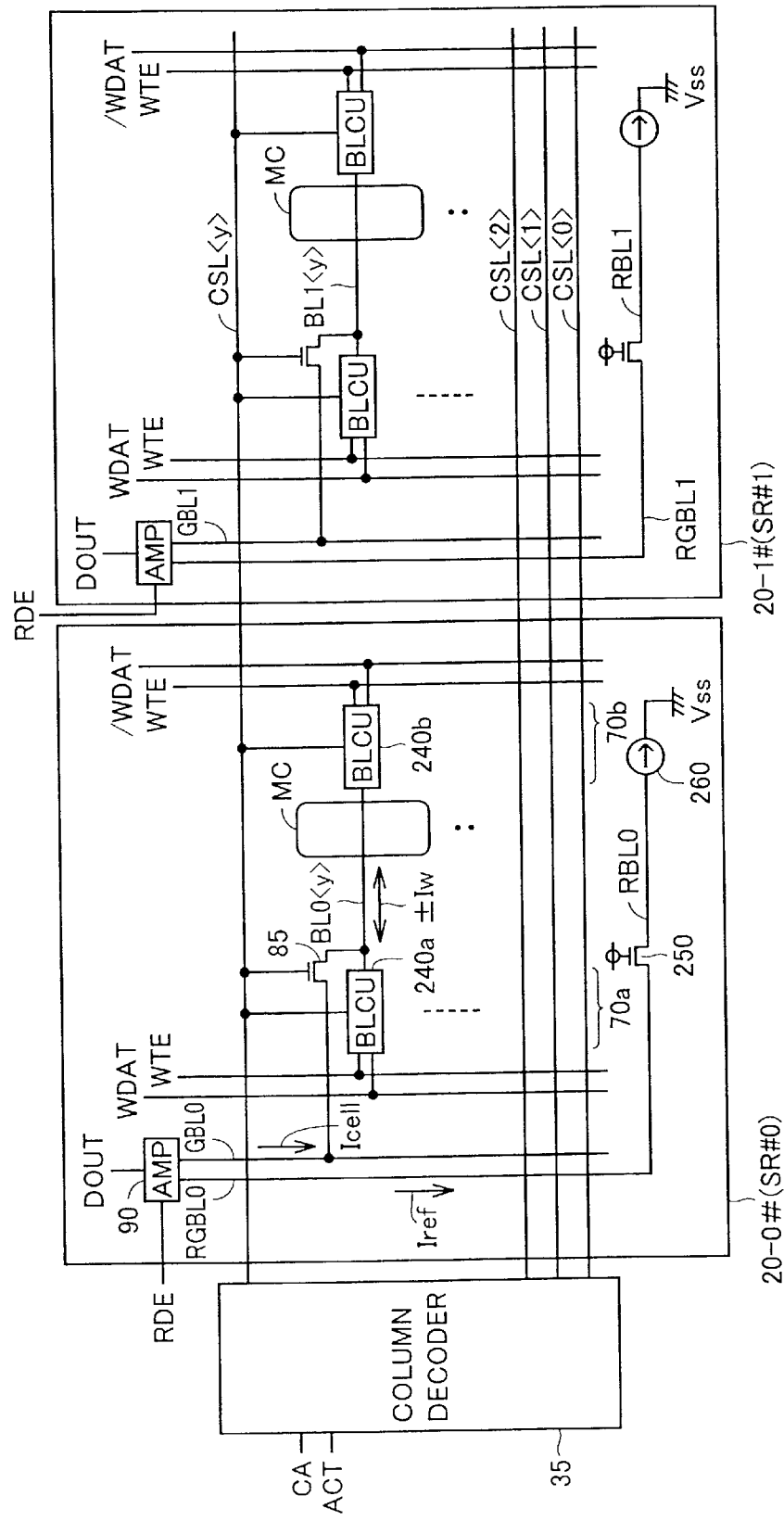
FIG. 5 is a block diagram showing a column select configuration in each subarray.

FIG. 5 is a block diagram showing a column select configuration in each subarray.

FIG. 5 representatively shows a column select configuration corresponding to a yth row in subarrays 20-0# and 20-1# belonging to subarray rows SR#0 and SR#1, respectively, of subarrays 20 belonging to a single, representatively shown subarray column, wherein y represents a natural number. Although not shown specifically, the same column select configuration is arranged in each subarray to correspond to each memory cell column.

Initially a column select configuration for a data write operation will be described.

Bit line current control circuit 70a includes a bit line control unit 240a for controlling a voltage of one end of each bit line BL and bit line current control circuit 70b includes a bit line control unit 240b for controlling a voltage of the other end of each bit line BL. FIG. 5 shows bit lines BL0<y> and BL1<y> and bit line control units 240a, 204b corresponding thereto.

Bit line control unit 240a controls a voltage of one end of a corresponding bit line BL in response to levels of control signal WTE, write data WDAT and a corresponding column select line CSL. In contrast, bit line control unit 240b controls a voltage of one end of a corresponding bit line BL in response to levels of control signal WTE, write data /WDAT and a corresponding column select line CSL.

For example, when control signal WTE is inactive (or low) bit line control units 240a, 240b corresponding to bit line BL0<y> do not connect one and the other ends of the bit line to either power supply voltage Vcc or ground Vss. In contrast, when control signal WTE is active (or high) the units operate in response to levels of write data WDAT, /WDAT and a corresponding column select line CSL<y> to connect one and the other ends of bit line BL0<y> to one and the other of power supply voltage Vcc and ground voltage Vss, respectively.

More specifically, when column select line CSL<y> has the low level, i.e., a corresponding memory cell column is not selected, bit line BL0<y> has the one and the other ends each disconnected from ground voltage Vss. In contrast, when column select line CSL<y> has the high level, i.e., a corresponding memory cell column is selected, bit line BL0<y> has one end the other ends connected to one and the other of power supply voltage Vcc and ground voltage Vss complementarily. For example, when write data WDAT has the high level (/WDAT has the low level) bit line BL0<y> has one end connected to power supply voltage Vcc and the other end to ground voltage Vss. In contrast, when write data WDAT has the low level (/WDAT has the high level) bit line BL0<y> has one end connected to ground voltage Vss and the other end to power supply voltage Vcc.

As a result, in a data write operation bit line BL of a selected column is supplied with a data write current±Iw having a direction corresponding to a level of write data WDAT. More specifically, when write data WDAT has the high level data write current+Iw is passed in a direction from bit line current control circuits 70a to 70b and when write data WDAT has the low level data write current−Iw is passed in a direction from bit line current control circuits 70b to 70a. Bit line BL of a non-selected column does not have a current flowing therethrough.

Each subarray is provided with a data read configuration, as described hereinafter.

For each subarray a global bit line GBL and a reference global bit line RGBL connected to read amplifier 90 are provided. FIG. 5 representatively shows global bit lines GBL0, GBL1 and reference global bit lines RGBL0, RGBL1 corresponding to subarrays 20-0# and 20-1#.

In each subarray global bit line GBL is connected to each bit line BL via a column select switch 85 provided to correspond to each memory cell column. Column select switch 85 configures bit line selector 80 shown in FIG. 2. Reference global bit line GBL is connected to a current source 260 via a transistor switch 250.

Column select switch 85 and transistor switch 250 are configured by similarly designed n-MOS transistors, respectively. Column select switch 85 has its gate connected to column select line CSL corresponding thereto. More specifically, column select switches 85 corresponding to bit lines BL0<y> and BL1<y> are each connected to column select line CSL<y>. Thus in each subarray bit line BL of a selected column is connected to global bit line GBL. As a result, global bit line GBL has flowing therethrough a memory cell current Icell corresponding to resistance Rmax or Rmin in response to a selected memory cell's resistance or stored data.

Transistor switch 250 has its gate fixed to have the high level, connected to power supply voltage Vcc. As a result, reference global bit line RGBL has a reference current Iref passed therethrough by current source 260. Reference current Iref is previously set to have a level intermediate two types of memory cell currents Icell corresponding to resistance Rmax and Rmin of MTJ memory cell. As such, read amplifier 90 can compare current passing through global bit line GBL and reference global bit line RGBL to generate data DOUT read from a selected memory cell. Read amplifier 90 is set operative in response to control signal RDE activated when data is read.

Figure 6:
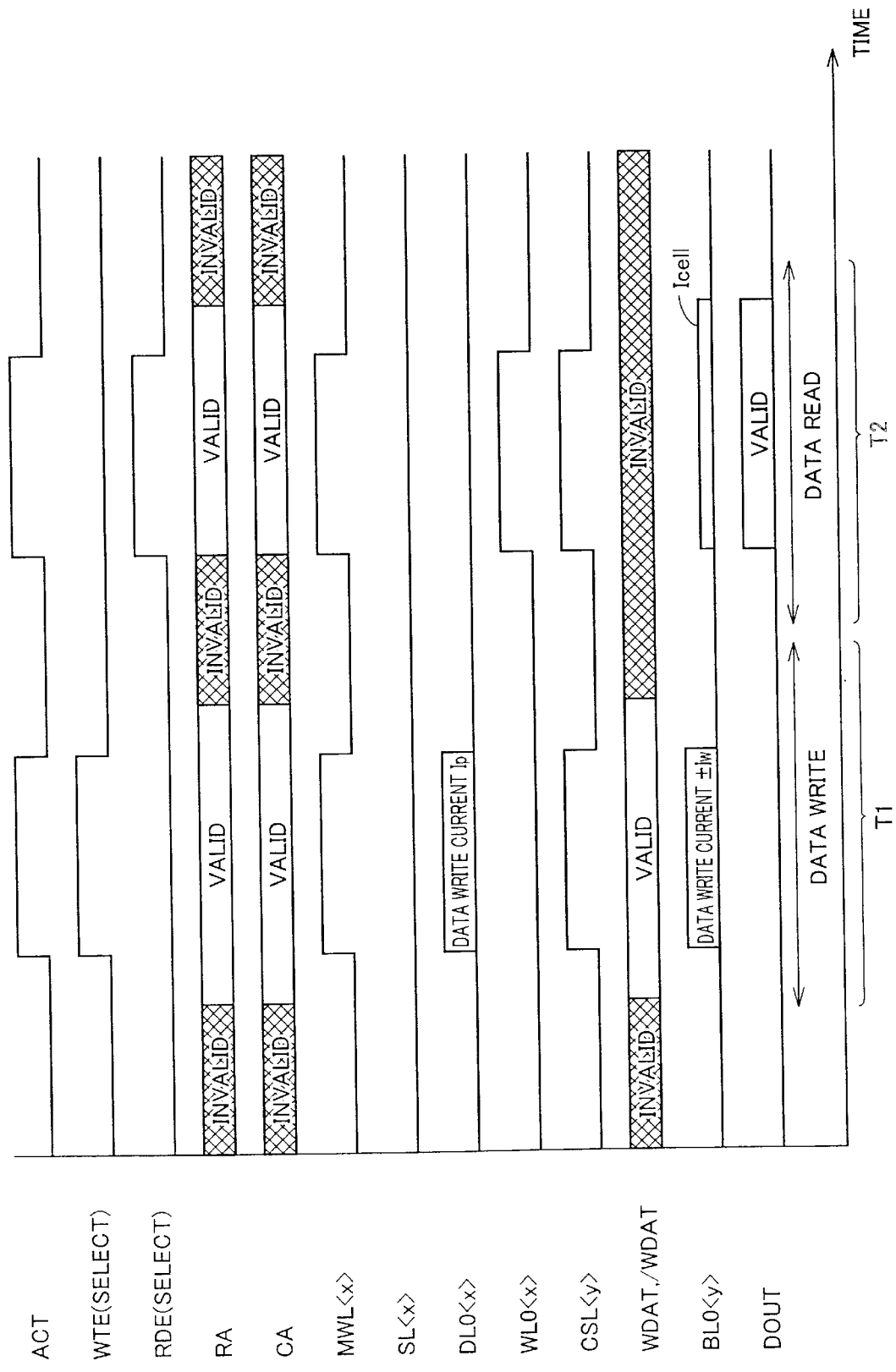
FIG. 6 is a waveform diagram illustrating data write and read operations in an MRAM device having a divided array configuration.

FIG. 6 is a waveform diagram for illustrating data write and read operations in an MRAM device having a divided array configuration. FIG. 6 represents a waveform of an operation corresponding to a row and a column selected in subarray 20-0.

With reference to FIG. 6, in a data write period T1, together with a control signal ACT corresponding to a chip enable signal a control signal WTE indicating a data write is set high or activated. Furthermore, a row address RA and a column address CA are rendered valid to indicate to subject of the data write.

When an xth row and a yth column are selected by row and column addresses RA and CA, main word line MWL<x> is driven high or activated and correspondingly in subarray 20-0 digit line DL0<x> has data write current Ip flowing therethrough.

Furthermore in response to column address CA column select line CSL<y> of a selected column is driven high or activated. Correspondingly the selected column's bit line control units 240a, 240b (FIG. 5) operate to pass through the selected column's bit line BL0<y> data write current±Iw corresponding to a level of write data WDAT.

In contrast, in a data read period T2, together with control signal ACT control signal RDE indicating a data read is driven high or activated. Furthermore, row and column addresses RA and CA are rendered valid to indicate a subject of the data read.

When the xth row and the yth row are selected by row and column addresses RA and CA, main word line MWL<X> is driven high or activated and correspondingly in subarray 20-0 word line WL0<x> is driven high or activated. As a result, a selected column's bit line BL0<y> has flowing therethrough memory cell current Icell corresponding to data stored in a selected memory cell. Memory cell current Icell is transmitted to read amplifier 90 via column select switch 85 turning on in response to column select line CSL<y> being activated. Read amplifier 90 generates read data DOUT based on memory cell current Icell.

Thus in MRAM device 5 having the divided array configuration a row selection involving a hierarchical address selection is provided to read and write data.

Figure 7:
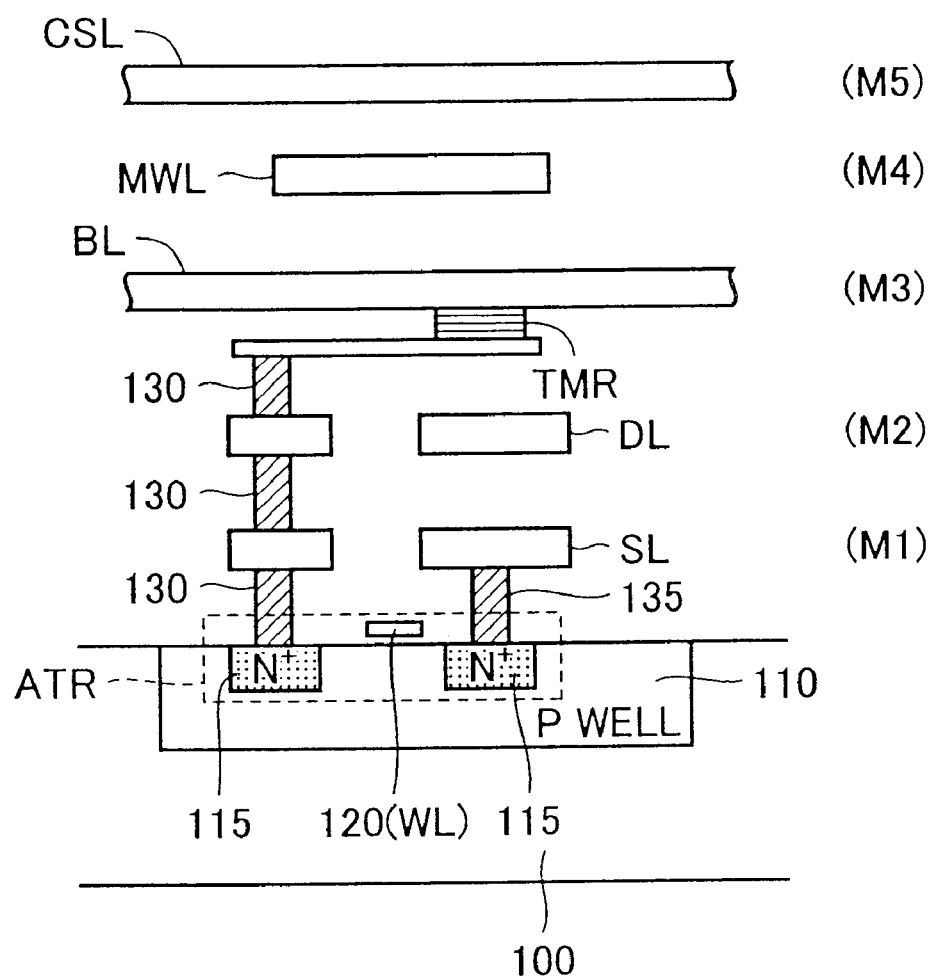
FIG. 7 is a cross section of a general configuration around an MTJ memory cell in an MRAM device in accordance with a divided array configuration.

FIG. 7 is a cross section of a general configuration around an MTJ memory cell in an MRAM device having a divided array configuration.

With reference to FIG. 7, access transistor ATR, a constituent of MTJ memory cell, is formed by using an $n^+$ diffusion region 115 in a p well 110 provided on a semiconductor substrate 110. $N^+$ diffusion region 115 is divided into a region corresponding to a drain (hereinafter referred to as a "drain region") and a region corresponding to a source (hereinafter referred to as a "source region").

The drain region is electrically connected to a tunneling magneto-resistance element TMR via interconnection of metal interconnection layers M1, M2 and a contact 130. Element TMR is also electrically connected to bit line BL provided at metal interconnection layer M3. The source region is connected through a contact 135 to source line SL provided at metal interconnection layer M1. Digit line DL is provided at metal interconnection layer M2. Although element TMR and digit line DL are not electrically coupled together, they are adjacently arranged so that a magnetic field created by a current flowing through digit line DL has a sufficient intensity in element TMR.

Furthermore, metal interconnection layers M4 and M5 overlying bit line BL are used to arrange main word line MWL and column select line CSL corresponding to a global address select line shared among a plurality of subarrays 20. As such an MRAM device having a divided array configuration provides an increased number of metal interconnection layers required.

Array Configuration in the First Embodiment

The configuration in the first embodiment also provides an MRAM device having a divided array configuration similar to that shown in FIGS. 1 and 2, except that each subarray 20 has an internal configuration different from conventional.

Figure 8:
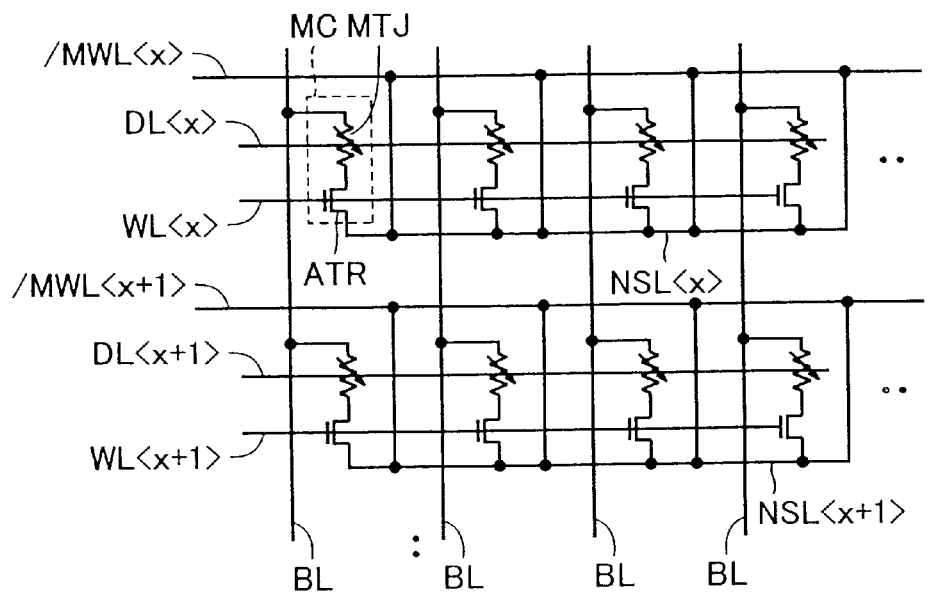
FIG. 8 is a circuit diagram showing a connection in accordance with a first embodiment of an interconnection corresponding to an MTJ memory cell.

FIG. 8 is a circuit diagram showing a connection in the first embodiment of an interconnection corresponding to an MTJ memory cell.

With reference to FIG. 8, in each subarray 20 access transistors ATRs corresponding to a single memory cell row have their respective source regions electrically coupled together and provided as an $n^+$ diffusion node NSL cell extending in the direction of the row. As such in the configuration of the first embodiment in each subarray 20 $n^+$ diffusion node NSL is provided to correspond to each memory cell row. FIG. 8 representatively shows $n^+$ diffusion nodes NSL<x> and NSL<x+1> corresponding to an xth row and an (x+1)th row, respectively.

$N^+$ diffusion node NSL is electrically connected in subarray 20 to a corresponding main word line /MWL. For example, $n^+$ diffusion nodes NSL<x> and NSL<x+1> are electrically connected to corresponding main word lines /MWL<x> and /MWL<x+1>, respectively. Each main word line /MWL has an inverted level of main word line MWL so far described and main word line /MWL that has been precharged to have the high level (power supply voltage Vcc) is set low or activated in each of data read and write operations in a selected row.

Figure 9:
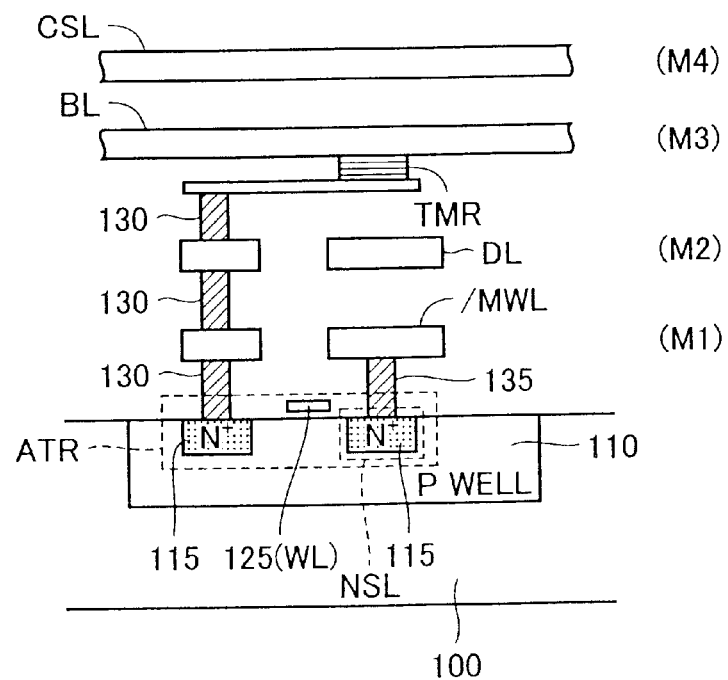
FIG. 9 is a cross section of a configuration in accordance with the first embodiment around an MTJ memory cells.

FIG. 9 is a cross section showing a configuration in accordance with the first embodiment around an MTJ memory cell.

With reference to FIG. 9, the configuration of the first embodiment implements source line SL in FIG. 7 not by a metal interconnection but $n^+$ diffusion node NSL extending in the direction of the row. As such, main word line /MWL is arranged at metal interconnection layer M1 and also electrically connected to a corresponding memory cell row's diffusion node NSL via contact 135. Column select line CSL in the FIG. 7 configuration is formed in metal interconnection layer M4 having main word line MWL arranged therein. As a result, the number of metal interconnections required for the MTJ memory cell decreases by one as compared with the FIG. 7 configuration.

Note that only at least one contact 135 is required for each diffusion node NSL for connecting diffusion node NSL and main word line/MWL together. Accordingly, it is not necessary to provide contact 135 for each MTJ memory cell, as shown in FIG. 9.

Figure 10:
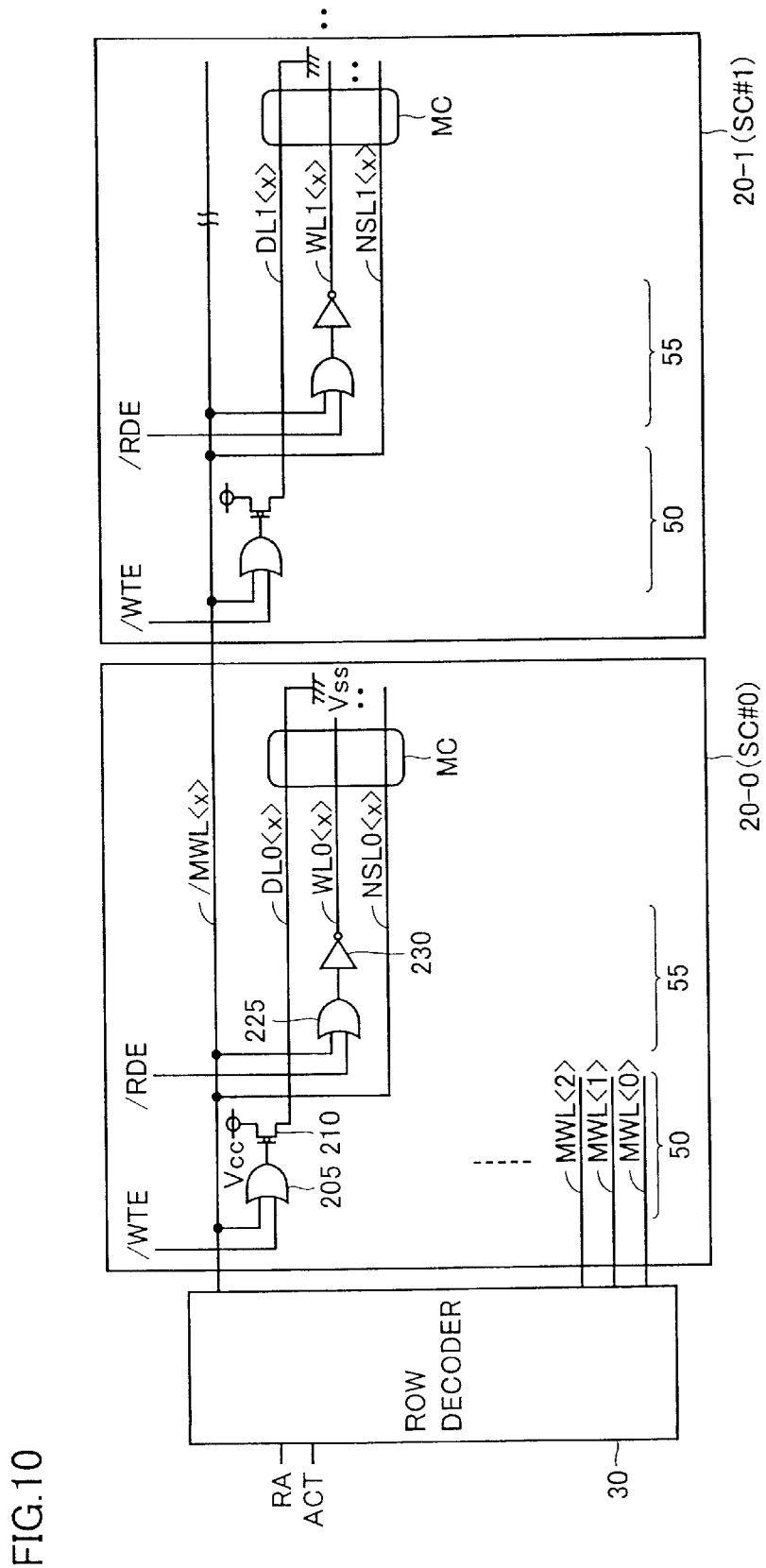
FIG. 10 is a circuit diagram showing a row select configuration in accordance with the first embodiment in each subarray.

FIG. 10 is a circuit diagram showing a row select configuration in each subarray in the first embodiment. FIG. 10 also representatively shows a configuration of a portion similar to that shown in FIG. 4.

When FIG. 10 is compared with FIG. 4, the configuration of the first embodiment provides digit line drive circuit 50 having logic gate 200 of FIG. 4 replaced with a logic gate 205. Driver transistor 210 has its gate receiving a signal output from logic gate 205.

Logic gate 205 outputs an OR of control signal /WDE and a corresponding main word line /MWL. Control signal /WTE has an inverted level of control signal WTE so far described. As such each digit line DL has one end with a voltage set similarly as in FIG. 4.

Furthermore word line drive circuit 55 has logic gate 220 of FIG. 4 replaced with a logic gate 225 outputting an OR of a control signal /RED and a corresponding main word line /MWL. Control signal /RED has an inverted level of control signal RDE so far described. Drive inverter 230 drives a corresponding word line WL's voltage in response to a signal output from logic gate 225. As such, word line WL's voltage is also set similarly as in FIG. 4.

In contrast in a selected row $n^+$ diffusion node NSL connected to the source region of access transistor ATR is set to ground voltage Vss in response to a corresponding main word line /MWL being activated. Consequently in a selected memory cell current Icell similar to the conventional configuration is generated.

Figure 11:
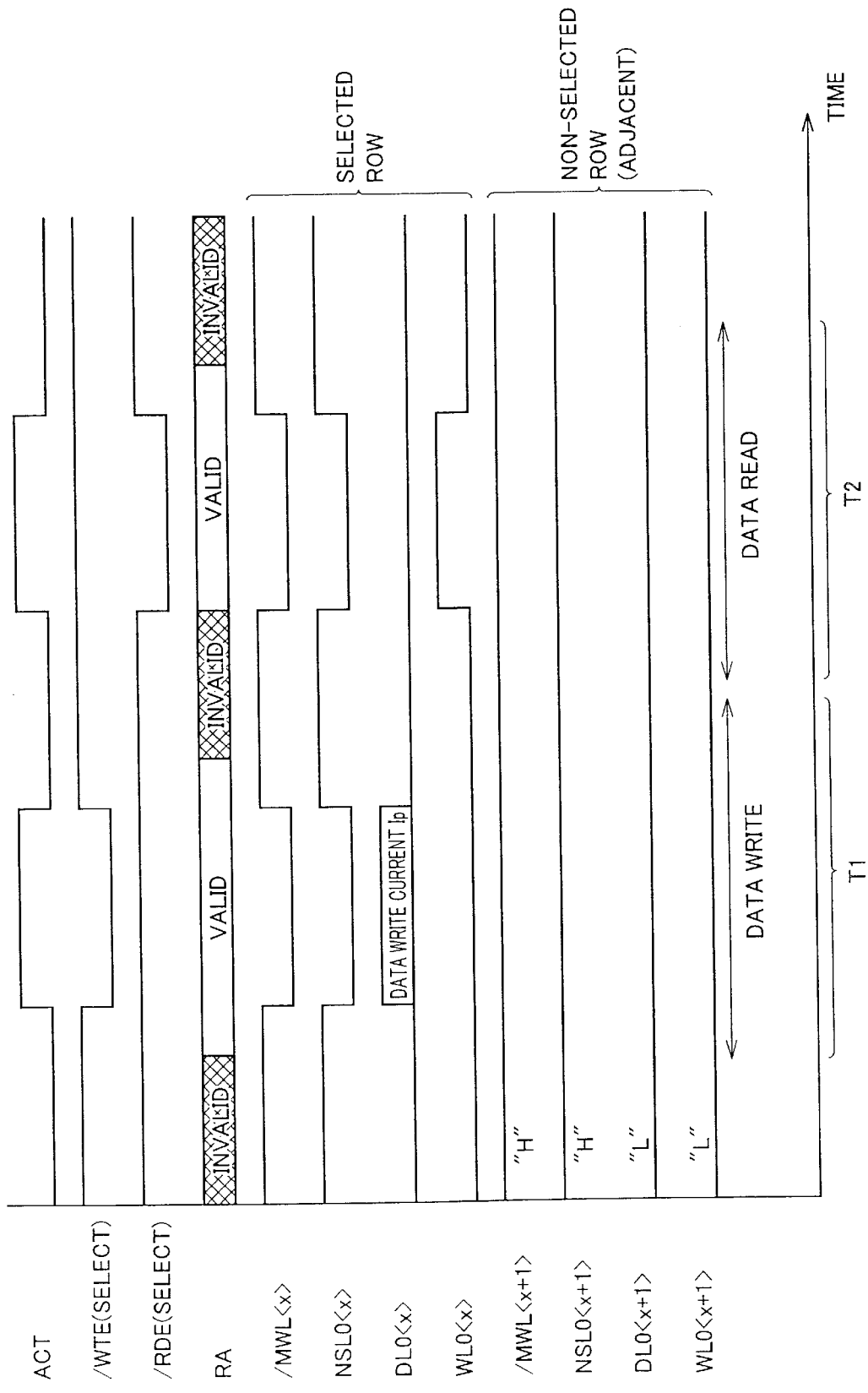
FIG. 11 is a waveform diagram for illustrating a row select operation in the first embodiment.

FIG. 11 is a waveform diagram of an operation for illustrating a row select operation in accordance with the first embodiment. FIG. 11 represents a row select operation selecting an xth row in subarray 20-0.

With reference to FIG. 11, chip enable signal ACT is set similarly as shown in FIG. 6 and control signals /WTE and /RDE have inverted levels of control signals WTE and RDE shown in FIG. 6.

In each of data write and read operations in response to main word line /MWL<x> being activated a diffusion node NSL0<x> is also set low (ground voltage Vss). A non-selected row's $n^+$ diffusion node NSL0<x+1> in each of data read and write operations is fixed to the high level (power supply voltage Vcc).

In data write period T1, in a selected row, data write current Ip is passed through digit line DL0<x> in response to driver transistor 210 turning on. In a non-selected row, digit line DL0<x+1> does not have a data write current flowing therethrough as driver transistor 210 maintains the off state.

Furthermore when in a non-selected row $n^+$ diffusion node NSL is set high a corresponding word line WL inactivated (set low) allows access transistor ATR to maintain the off state. As such, connecting main word line /MWL and $n^+$ diffusion node NSL does not impair normal data write operation. As a result, a column select operation similar to that of FIG. 6 supplying a selected column's bit line BL with a data write current normally allow a data write similarly as shown in FIG. 6.

In data read period T2, as well as in the FIG. 6 operation, a selected row's word line WL0<x> is set high activated, whereas a non-selected row's word line WL<x+1> is held low or inactivated. In the selected row a corresponding $n^+$ diffusion node NSL0<x> is set low (ground voltage Vss) and access transistor ATR accordingly turns on and memory cell current Icell similar to that of FIG. 6 is generated in a selected column's bit line BL.

In the non-selected row, in contrast, a corresponding $n^+$ diffusion node NSL0<x+1> is fixed high and a corresponding word line WL<x+1> is set low or inactivated. As such in the non-selected row access transistor ATR is held off and connecting main word line /MWL and $n^+$ diffusion node NSL does not impair normal data read operation. In other words, a data read operation similar to that of FIG. 6 is normally effected.

Thus the first embodiment provides a configuration allowing an MRAM device having a divided subarray configuration with a plurality of subarrays sharing a global address select line (a main word line) electrically connected to a source region of access transistor ATR to provide a reduced number of metal interconnection layers required.

As a result, simply by providing a region in a memory cell array with a contact electrically coupling the source region and a main word line together, i.e., without increased chip area, a reduced number of metal interconnection layers can be provided.

Exemplary Variation of the First Embodiment

The first embodiment in an exemplary variation describes a configuration applying an MTJ memory cell employing a diode for an access element.

Figure 12:
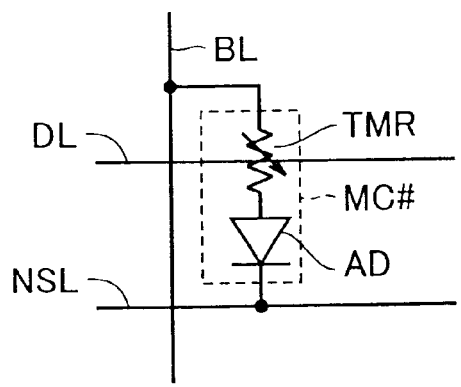
FIG. 12 is a circuit diagram showing a configuration of an MTJ memory cell with a diode serving as an access element.

FIG. 12 is a circuit diagram showing a configuration of an MTJ memory cell MC# with a diode serving as an access element.

With reference to FIG. 12, MTJ memory cell MC# includes a tunneling magneto-resistance element TMR connected to bit line BL, and an access diode AD connected between element TMR and $n^+$ diffusion node NSL. Access diode AD is connected to have a forward direction corresponding to a direction directed from element TMR toward source line SL. Digit line DL, as well as MTJ memory cell having an access transistor, is provided adjacent to element TMR.

Figure 13:
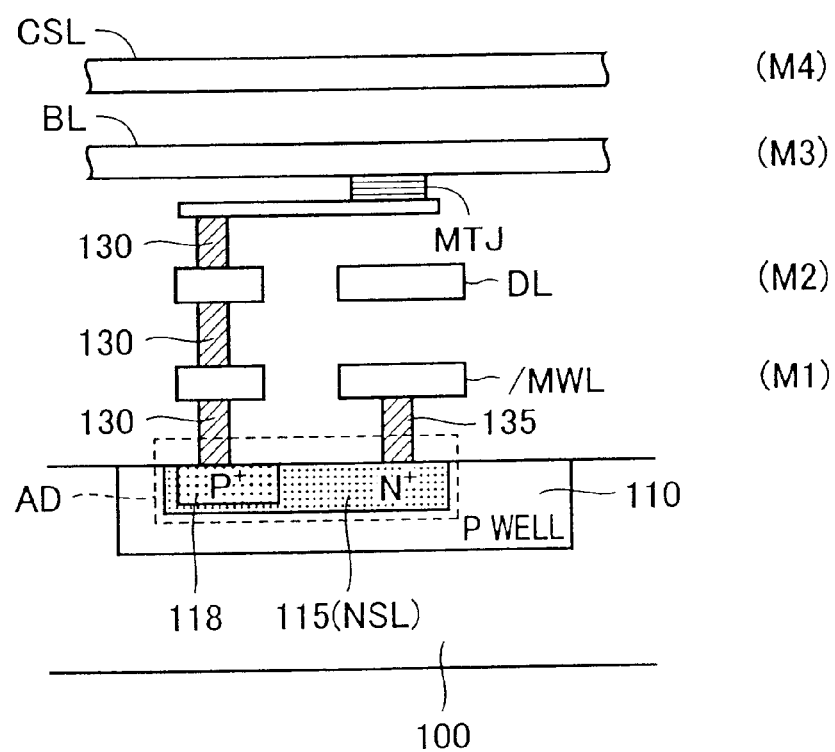
FIG. 13 is a cross section for illustrating a configuration of the MTJ memory cell shown in FIG. 12.

FIG. 13 is a cross section for illustrating a configuration of MTJ memory cell MC# shown in FIG. 12.

With reference to FIG. 13, a $p^+$ region 118 is further provided in $n^+$ region 115 provided in p well 110 provided similarly as shown in FIG. 9. $P^+$ region 118 and $n^+$ region 115 provide a pn junction therebetween, which implements access diode AD. More specifically, $p^+$ region 118, corresponding to an anode of access diode AD, is electrically connected to tunneling magneto-resistance element TMR via contact 130. $N^+$ region 115, corresponding to a cathode of access diode AD, is connected via contact 135 to main word line /MWL provided at metal interconnection layer M1.

Similarly as in the configuration of the MTJ memory cell shown in FIG. 9, digit line DL is provided at metal interconnection layer M2 and tunneling magneto-resistance element TMR is electrically connected to bit line BL provided at metal interconnection layer M3. Furthermore, column select line CSL is arranged at metal interconnection layer M4.

Configured as described above, the configuration of the first embodiment with an MTJ memory cell having an access diode applied thereto can also enjoy a similar effect.

Second Embodiment

The first embodiment has described that in each memory cell row, access transistor ATR has its source region connected to main word line /MWL of a corresponding memory cell row. In this configuration, however, when a data read operation starts, the access transistor's source voltage varies. Before the source voltage stabilizes, an accurate data read operation would not be provided.

Accordingly the second embodiment describes a configuration capable of obtaining an effect similar to that of the first embodiment without the access transistor's source having a variation in voltage when a data read operation starts.

Figure 14:
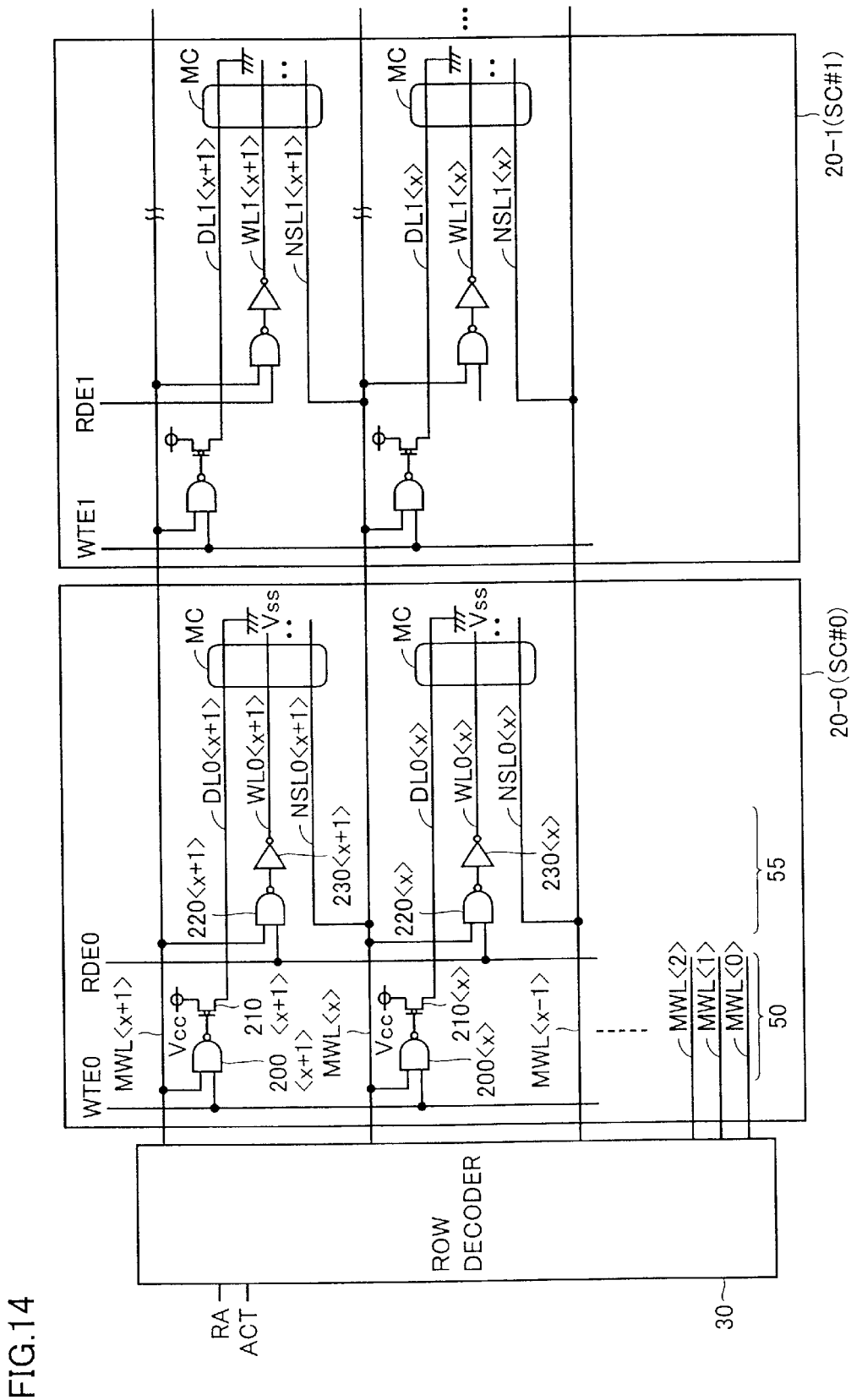
FIG. 14 is a circuit diagram showing a row select configuration in accordance with a second embodiment in each server array.

FIG. 14 is a circuit diagram showing a row select configuration in each subarray in the second embodiment. FIG. 14 representatively shows a row select configuration corresponding to x– and (x+1)th rows of subarrays 20-0 and 20-1. Although not shown in detail, the same row select configuration is arranged for each subarray to correspond to each memory cell row.

With reference to FIG. 14, in each subarray 20 at each memory cell row an access transistor's source is coupled with $n^+$ diffusion node NSL connected to main word line MWL corresponding to a memory cell row other than a memory cell row corresponding thereto. For example in subarray 20-0 diffusion node NSL0<x>, corresponding to the xth row, is connected to main word line MWL<x–1> corresponding to an (x–1)th row. Similarly, diffusion node NSL0<x+1>, corresponding to an (x+1)th row, is connected to main word line MWL<x> of the xth row.

In each memory cell row, logic gates 200, 220, driver transistor 210 and drive inverter 230 are arranged, similarly as shown in FIG. 4.

Figure 15:
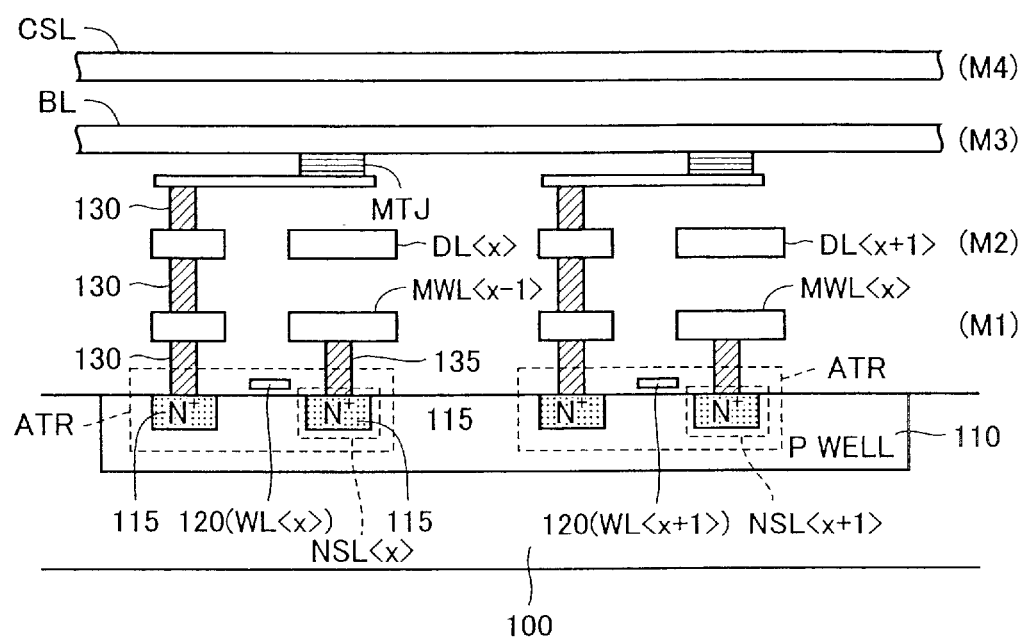
FIG. 15 is a cross section showing a configuration in accordance with the second embodiment around an MTJ memory cell.

FIG. 15 is a cross section of a configuration around an MTJ memory cell in the second embodiment. FIG. 15 shows a cross section of MTJ memory cell of adjacent x– and (x+1)th rows.

With reference to FIG. 15, as configured in accordance with the second embodiment, $n^+$ diffusion node NSL corresponding to a source region of access transistor ATR is also connected via contact 135 to main word line MWL corresponding to a different memory cell row that is provided at metal interconnection layer M1. For example in the xth row's MTJ memory cell $n^+$ diffusion node NSL0<x> is connected to an adjacent row's main word line MWL<x–1> and in the (x+1)th row's MTJ memory cell $n^+$ diffusion node NSL0<x+1> is connected to an adjacent row's main word line MWL<x>. MTJ memory cells in the remaining portion are configured and connected to other interconnections, as has been described previously with reference to FIG. 9.

Figure 16:
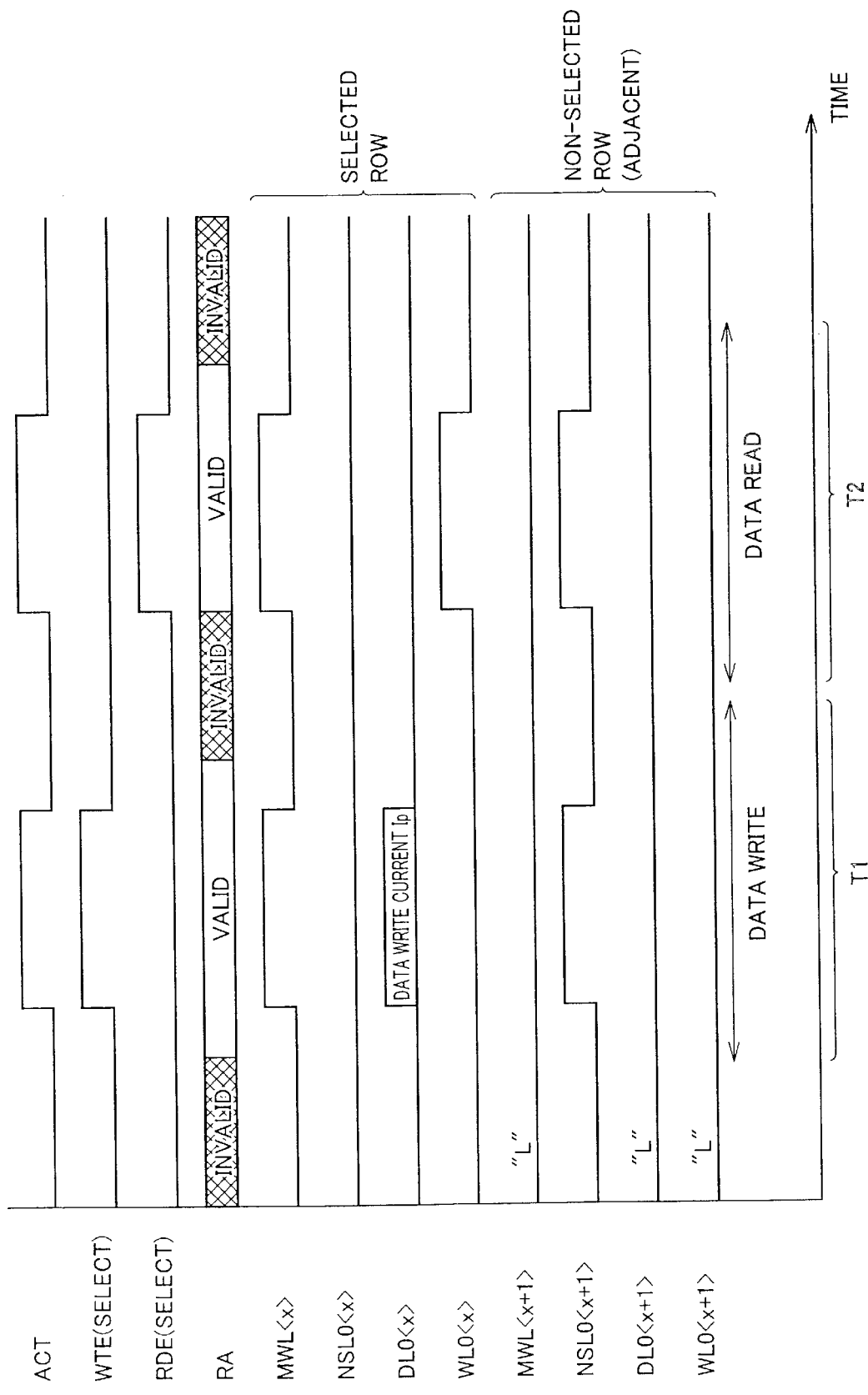
FIG. 16 is a waveform diagram representing a row select operation in the second embodiment.

FIG. 16 is a waveform diagram of an operation illustrating selecting a row in accordance with the second embodiment. FIG. 16 also shows a row select operation in subarray 20-0 when the xth row is selected.

With reference to FIG. 16, chip enable signal ACT and control signals WTE and RDE are set similarly as represented in FIG. 6.

In each of data write and read operations a non-selected row's main word lines MWL<x–1>, MWL<x+1> is fixed to the low level corresponding to a precharged level, whereas a selected row's main word line MWL<x> is activated from the low level to the high level.

In accordance with a result of the row select operation $n^+$ diffusion node NSL0<x> is set to a voltage similar to that of main word line MWL<x–1> and $n^+$ diffusion node NSL0<x+1> is set to a voltage similar to that of main word line MWL<x>.

Consequently in data write period T1 a selected row has digit line DL0<x> having data write current Ip flowing therethrough in response to driver transistor 210 turning on, while the non-selected row has digit line DL0<x+1> free of a data write current as driver transistor 210 maintains the off state.

Furthermore, while in non-selected (x+1)th row $n^+$ diffusion node NSL0<x+1> is set high, main word line MWL<x+1> that maintains inactivation (the low level) of the corresponding word line WL0<x+1> allows access transistor ATR to maintain the off state. As a result, a non-selected row with the corresponding $n^+$ diffusion node NSL connected to a selected row's main word line MWL can also be free of impaired data write operation.

Thus a column select operation similar to that represented in FIG. 6 allows a selected column's bit line BL to be supplied with a data write current to normally perform a data write operation similar to that represented in FIG. 6.

In data read period T2 a selected row's $n^+$ diffusion node NSL0<x> is maintained at the low level corresponding to a precharged level, and in response to a corresponding word line WL0<x> being activated, access transistor ATR turns on and memory cell current Icell similar to that of FIG. 6 is generated on bit line BL of a selected column. As distinguished from the configuration of the first embodiment, in this process when a data read operation is initiated access transistor ATR's source voltage does not vary. Contently memory cell current Icell can stabilize in a reduced period of time. As a result, data can be read rapidly.

Furthermore, while in non-selected (x+1)th row $n^+$ diffusion node NSL0<x+1> transitions high, main word line MWL<x+1> that maintains inactivation (the low level) of the corresponding word line WL0<x+1> allows access transistor ATR to maintain the off state. As a result, a non-selected row with the corresponding $n^+$ diffusion node NSL connected to a selected row's main word line MWL can also be free of impaired data read operation Thus the second embodiment, as well as the first embodiment, can provide a reduced number of metal interconnection layers to hierarchically select an address and also prevent a selected memory cell's access transistor source voltage from varying in initiating a data read operation so that data can be read rapidly.

Note that while the second embodiment illustrates an example so configured that in each memory cell row $n^+$ diffusion node NSL is connected to main word line MWL of an adjacent row, the connection between the node and the main word line is not limited to such an example. More specifically, it is not limited to an adjacent row, and connecting together main word line MWL corresponding to any other memory cell row that is not selected simultaneously when a self memory cell row is selected and the self memory cell row's $n^+$ diffusion node NSL can provide a similar effect.

Third Embodiment

A third embodiment describes a configuration providing a reduced number of interconnection layers by coupling a column select line of address select lines with a source of access transistor ATR.

Figure 17:
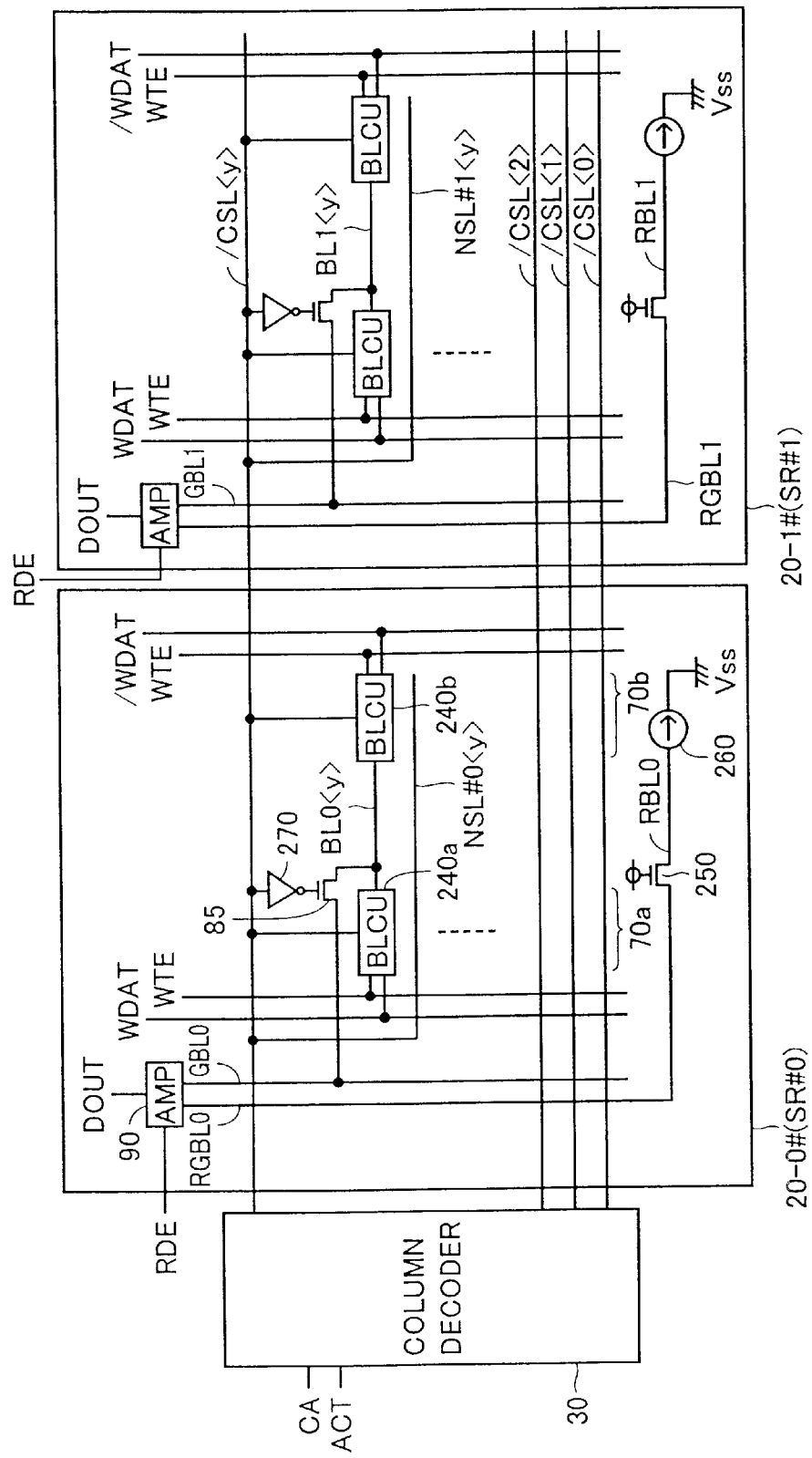
FIG. 17 is a circuit diagram showing a column select configuration in accordance with a third embodiment in each subarray.

FIG. 17 is a circuit diagram showing a column select configuration in each subarray in accordance with the third embodiment. FIG. 17, as well as FIG. 5, representatively shows a configuration corresponding to a yth column of subarrays 20-0#, 20-1#. Each of other subarrays has each memory cell column also provided with a similar configuration for the sake of illustration.

When FIG. 17 is compared with FIG. 5, the third embodiment provides a configuration in which a single memory cell column is associated with access transistors having their sources electrically coupled together by $n^+$ diffusion node NSL# electrically connected to column select line /CSL corresponding thereto. For example, diffusion nodes NSL#0<y> and NSL#1<y> are connected to column select line /CSL<y>.

Column select line /CSL has an inverted level of column select line CSL shown in FIG. 5, and column select line /CSL having been precharged to the high level is selectively set low (ground voltage Vss)or activated in each of data write and read operations.

Inverter 270 inverts a level in voltage of column select line /CSL and applies it to a gate of column select switch 85. Furthermore in bit line control units 240a, 240b in response to levels of control signal WTE, column select line /CSL and write data WDAT, a corresponding bit line BL's opposite ends are controlled in voltage, similarly as has been described in FIG. 5.

Figure 18:
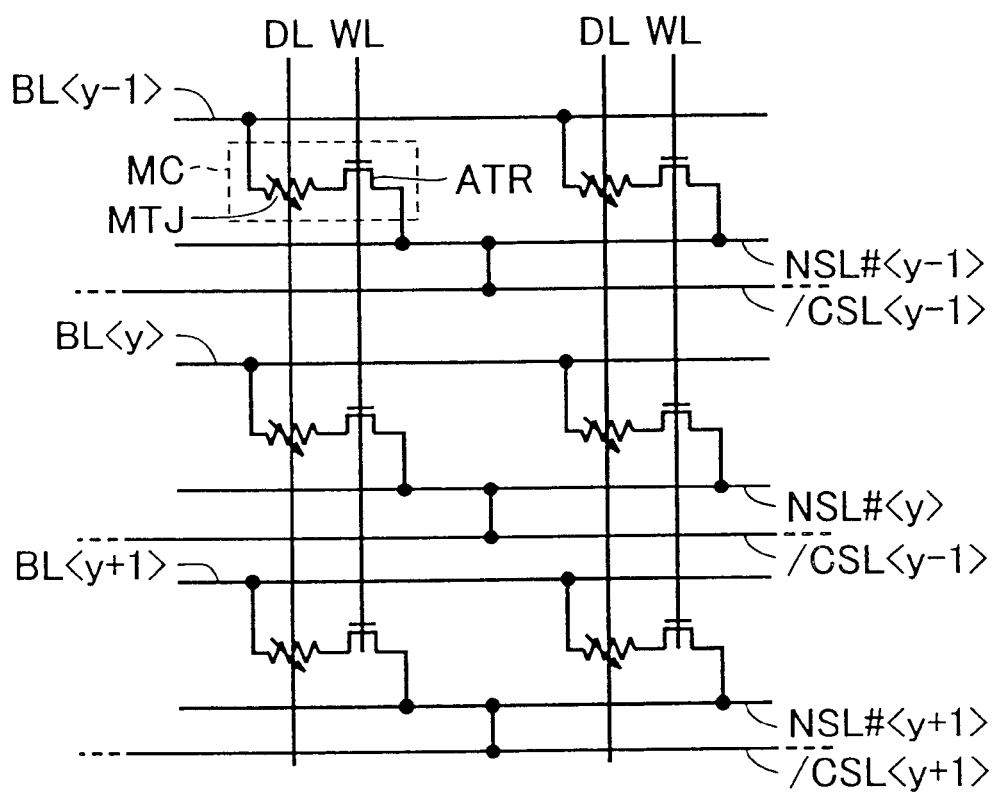
FIG. 18 is a circuit diagram showing a connection in accordance with the third embodiment of an interconnection corresponding to an MTJ memory cell.

FIG. 18 is a circuit diagram showing a connection of an interconnection corresponding to an MTJ memory cell in the third embodiment.

With reference to FIG. 18, as configured in the third embodiment, n+diffusion node NSL# extends in the direction of the column to electrically couple together source regions of access transistors ATRs of a single memory cell column. More specifically, $n^+$ diffusion node NSL# is provided to correspond to each memory cell column.

FIG. 18 shows a configuration corresponding to (y−1)-, y- and (y+1)th columns representatively. As has been shown in FIG. 17, $n^+$ diffusion nodes NSL#<y−1>, NSL#<y>, NSL#<y+1> corresponding to these memory cell columns are electrically connected to column select lines /CSL<y−1>, /CSL<y>, /CSL<y+1>, respectively.

Figure 19:
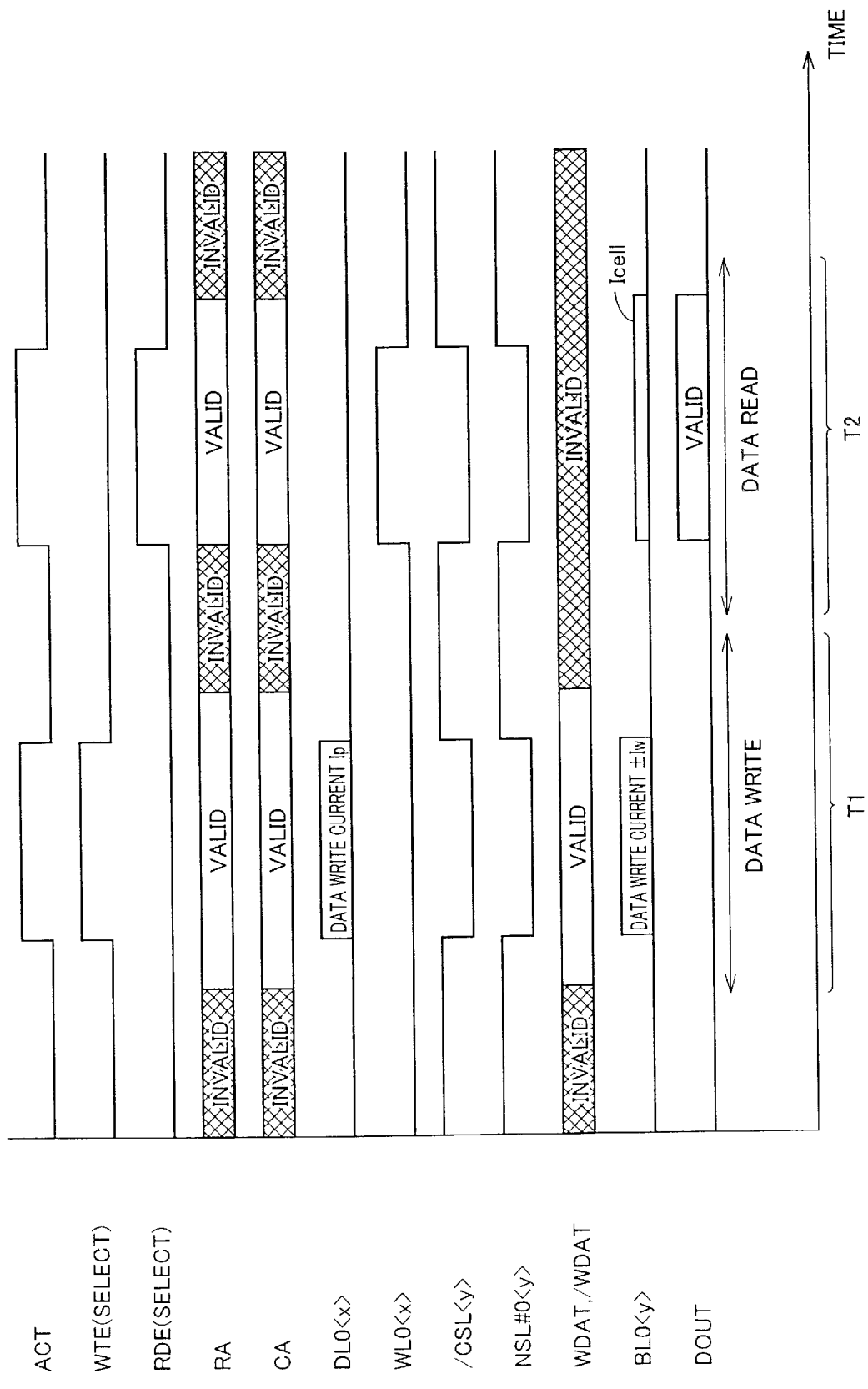
FIG. 19 is a waveform diagram for illustrating a column select operation in accordance with the third embodiment.

FIG. 19 is a waveform diagram of an operation representing a column select operation in the third embodiment. FIG. 19 represents data read and write operations in subarray 20-0 when the xth row and the yth column are selected.

With reference to FIG. 19, control signals ACT, WTE, RDE are set, similarly as represented in FIG. 6.

Column select line /CSL having been precharged to the high level (power supply voltage Vcc) is set low or activated in each of data write and read operations at a selected column. Accordingly, each access transistor ATR source voltage (diffusion node NSL), also having been precharged to the high level, transitions only at the selected column to the low level (ground voltage Vss).

In data write period T1 digit line DL0<x> selected by the row select configuration as has been described previously has data write current Ip flowing therethrough and bit line BL0<y> selected by column select line /CSL<y> has flowing therethrough data write current±Iw having a direction in accordance with write data WDAT.

Correspondingly, each word line WL is set low or inactivated, and in each MTJ memory cell including the selected column's MTJ memory cell access transistor ATR is held off. As such, connecting column select line /CSL and $n^+$ diffusion node NSL# does not impair normal data write operation.

In data read period T2 the row select configuration previously described sets each digit line DL low or inactivates the digit line and prevents a current from flowing.

Furthermore, in response to column select line /CSL<y> being activated, a selected memory cell connected to $n^+$ diffusion node NSL#<y> has its access transistor's source transitioning in voltage to a ground voltage. This turns on the access transistor. Furthermore, the row select configuration previously described activates a selected row's word line WL0<x> and responsively a selected memory cell's access transistor ATR turns on. Consequently, memory cell current Icell is generated in the selected column's bit line BL0<x> and in accordance therewith read data DOUT is ascertained.

In a non-selected row, word line WL is held low and access transistor ATR is accordingly held off. More specifically, the selected column's nonselected memory cell (other than the yth row) has access transistor ATR held off. As such, connecting column select line /CSL and $n^+$ diffusion node NSL# does not impair normal data read operation.

Thus in the third embodiment an access transistor (an access element) has a gate receiving a signal line (word line WL) indicating a result of a row select operation. As such, whether or not a column is selected hierarchically, a signal line indicating a result of a column select operation, or a column select line, can be coupled with the access transistor's source to provide a reduced number of metal interconnection layers required.

In other words, as has been described in the first and second embodiments, not only a global select line (main word lines MWL, /MWL) in hierarchically selecting a row but a select line effecting selecting a column in the subarray of interest can also be coupled with diffusion node NSL# provided to correspond to each memory cell column.

Consequently an MTJ memory cell can be associated with a reduced number of metal interconnection layers required for arranging metal interconnections required for selecting an address so that it can be fabricated at reduced cost.

Exemplary Variation of the Third Embodiment

A configuration connecting to an access transistor's $n^+$ diffusion node NSL# a select line associated with a memory cell column described in the third embodiment is also susceptible to a variation similar to the first and second embodiments.

Figure 20:
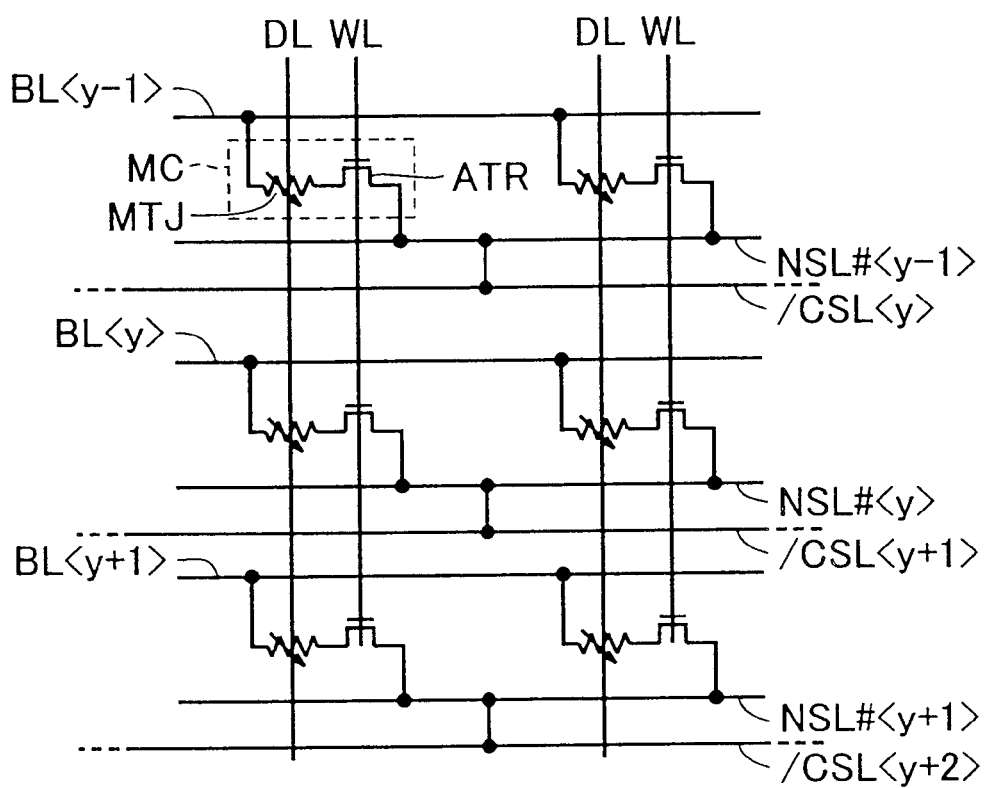
FIG. 20 is a circuit diagram showing a connection in accordance with an exemplary variation of the third embodiment of an interconnection corresponding to an MTJ memory cell.

For example, as shown in FIG. 20, diffusion node NSL# corresponding to each memory cell column may be connected to column select line CSL of a different memory cell column (e.g., an adjacent memory cell column).

Column select line CSL has an inverted level in voltage of column select line /CSL described in the third embodiment, and column select line CSL having been precharged to have the low level (ground voltage Vss) is set high or activated in each of data read and write operations at a selected column. This can prevent a selected memory cell's access transistor ATR from having its source significantly varying in voltage immediately after a data read operation is initiated. Data can be read rapidly, similarly as has been described in the second embodiment.

Figure 21:
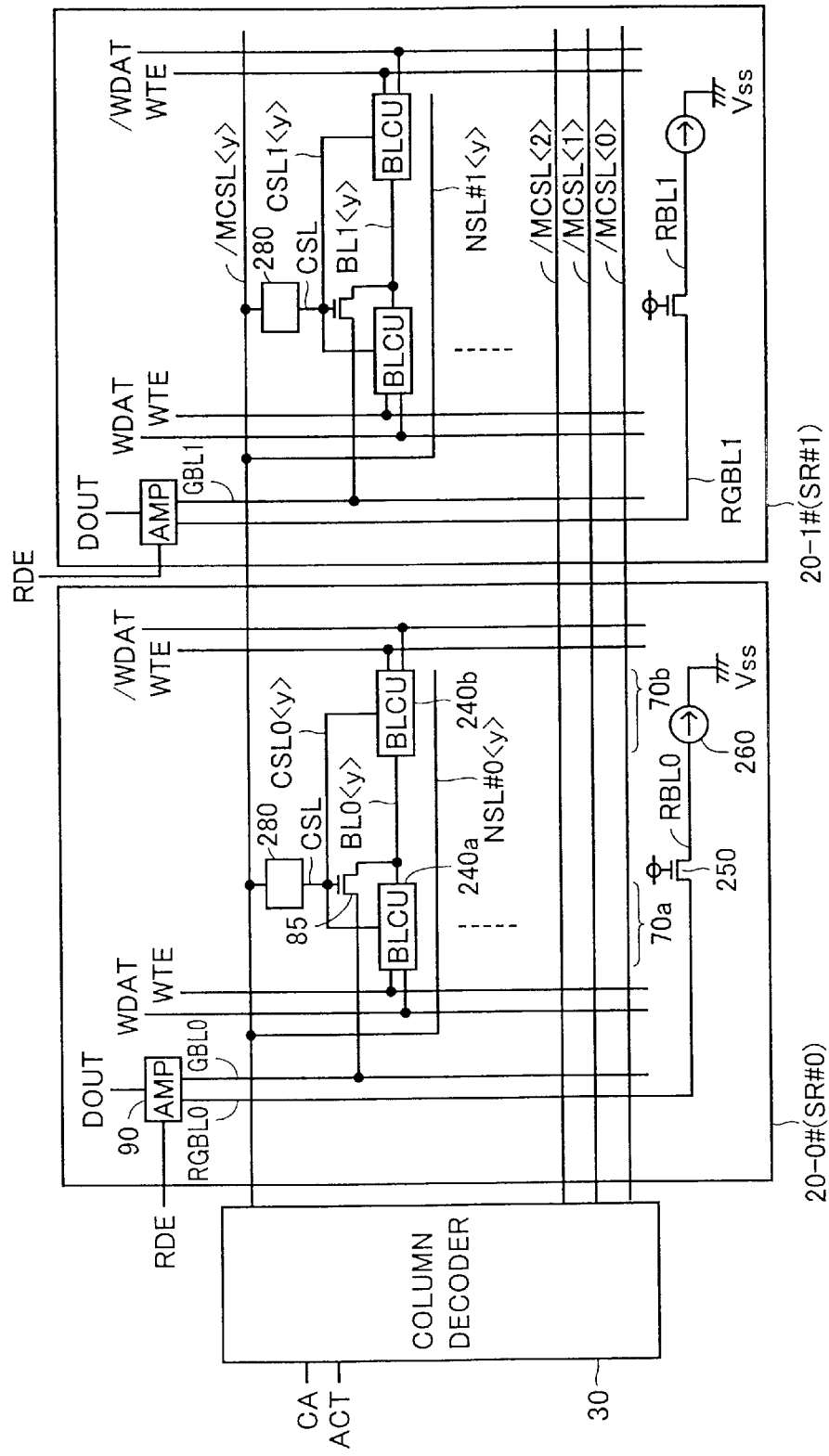
FIG. 21 is a circuit diagram showing a column select configuration in accordance with an exemplary variation of the third embodiment in each subarray.

Alternatively, as shown in FIG. 21, a configuration effecting hierarchically selecting a column is also susceptible of the third embodiment. FIG. 21, as well as FIG. 17, representatively shows a configuration corresponding to the yth column of subarrays 20-0#, 20-1#.

In this example, column select line /CSL described in the third embodiment is provided as a main column select line /MCSL corresponding to a global select line shared among subarrays belonging to a single subarray row, and in each subarray, column select line CSL for selecting a column is set by a column select line driver 280 in accordance with a level of main column select line /MCSL corresponding thereto.

If required, column select line driver 280 may be driven by a result of a selection of subarray rows SR#0, SR#1 and a level of a corresponding main column select line /MCSL to set a level in voltage of each column select line CSL.

Furthermore, diffusion node NSL# is connected to main column select line /MCSL corresponding thereto. For example, diffusion nodes NSL#1<y+1> are electrically connected to main column select line /MCSL<y>.

Such a configuration also allows main column select line MCSL to be provided at main interconnection layer M1, as is main word line /MWL shown in FIG. 9. This can prevent the number of metal interconnection layers from increasing as an hierarchical address select configuration is adopted. Chips can be fabricated with less increased cost.

Alternatively, the FIG. 21 configuration and the FIG. 20 configuration may be combined to connect each diffusion node NSL# to main column select line MSCL corresponding to a different memory cell column (an inverted level of /MCSL) to read data rapidly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetic random access memory device comprising:
a memory cell array including a plurality of magnetic memory cells arranged in rows and columns, said memory cell array being divided into a plurality of subarrays arranged in rows and columns; and
a plurality of global select lines provided to correspond to one of the rows and the columns of said plurality of magnetic memory cells commonly for said subarrays sharing said one of the rows and the columns of said plurality of magnetic memory cells, said plurality of global select lines in each of data read and write operations each being set to a voltage corresponding to selection and non-selection of said one corresponding thereto, said plurality of subarrays each including a plurality of bit lines provided to correspond to said plurality of magnetic columns, a plurality of select lines provided to correspond to said one of the rows and the columns of said plurality of magnetic memory cells for selecting said one of the rows and the columns of said plurality of magnetic memory cells in said subarray corresponding thereto, and a plurality of select line drivers provided to correspond to said plurality of select lines, respectively, to each drive a voltage of a corresponding one of said select lines in response to said voltage of a corresponding one of said global select lines, said plurality of magnetic memory cells each having a magneto-resistance element electrically connected to a corresponding one of said bit lines, and an access element electrically connected between said magneto-resistance element and one of said plurality of global select lines, said access element in said data read operation turning on or off in response to a result of a row select operation in a corresponding one of said subarrays, said access element in said data write operation being turned off regardless of said result.

2. The magnetic random access memory device according to claim 1, wherein:
said access element is fabricated on a semiconductor substrate;
said magneto-resistance element is fabricated at a layer overlying said access element;
said plurality of global select lines are each fabricated at a layer intermediate said access element and said magneto-resistance element; and
each of said plurality of global select lines and said access element corresponding thereto are electrically coupled in a region internal to said memory cell array.

3. The magnetic random access memory device according to claim 1, wherein said plurality of global select lines are provided to correspond to said rows of said plurality of magnetic memory cells.

4. The magnetic random access memory device according to claim 3, wherein each of said global select lines having been precharged to attain a first voltage is set to attain a second voltage in each of said data read and write operations when a corresponding one of said rows is selected, said second voltage being different from said first voltage, and
in each of said plurality of magnetic memory cells said access element is electrically connected between said magneto-resistance element and that one of said plurality of global select lines which corresponds to one of said rows excluding the corresponding row.

5. The magnetic random access memory device according to claim 4, wherein:
said plurality of select lines each include a word line for indicating said result of said row select operation effected in said corresponding subarray in a data read operation, and a digit line for indicating said result of said row select operation effected in said corresponding subarray in a data write operation;
said access element is a field effect transistor having a gate connected to a corresponding one of said word lines; and
said plurality of select line drivers each drive a corresponding one of said word lines to a voltage allowing said access element corresponding thereto to turn on in accordance with a level in voltage of a corresponding one of said global select lines in said data read operation in which a corresponding one of said rows is selected.

6. The magnetic random access memory device according to claim 4, wherein said first voltages corresponds to the ground voltage.

7. The magnetic random access memory device according to claim 3, wherein each of said global select lines having been precharged to attain a first voltage is set to attain a second voltage in each of said data read and write operations when a corresponding one of said rows is selected, said second voltage being different from said first voltage, and
in each of said plurality of magnetic memory cells said access element is electrically connected between said magneto-resistance element and that one of said plurality of global select lines which corresponds to the corresponding row.

8. The magnetic random access memory device according to claim 7, wherein said access element is a diode connected such that a direction from a corresponding one of said bit lines toward the corresponding global select lines is a forward direction; and
said plurality of select lines each include a digit line for indicating said result of said row select operation performed in said corresponding subarray in said data write operation.

9. The magnetic random access memory device according to claim 7, wherein:

said plurality of select lines each include a word line for indicating said result of said row select operation effected in said corresponding subarray in a data read operation, and a digit line for indicating said result of said row select operation effected in said corresponding subarray in a data write operation;

said access element is a field effect transistor having a gate connected to a corresponding one of said word lines; and said plurality of select line drivers each drive a corresponding one of said word lines to a voltage allowing said access element corresponding thereto to turn on in accordance with a level in voltage of a corresponding one of said global select lines in said data read operation in which a corresponding one of said rows is selected.

10. The magnetic random access memory device according to claim 1, wherein:

said plurality of global select lines are provided to correspond to said columns of said plurality of magnetic memory cells; and said plurality of select lines each include a column select line for indicating a result of a column select operation performed in said corresponding subarray in each of said data read and write operations.

11. The magnetic random access memory device according to claim 10, wherein each of said global select lines having been precharged to attain a first voltage is set to attain a second voltage in each of said data read and write operations when a corresponding one of said columns is selected, said second voltage being different from said first voltage, and in each of said plurality of magnetic memory cells said access element is electrically connected between said magneto-resistance element and that one of said plurality of global select lines which corresponds to one of said columns excluding the corresponding column.

12. The magnetic random access memory device according to claim 11, wherein each of said global select lines having been precharged to attain a first voltage is set to attain a second voltage in each of said data read and write operations when a corresponding one of said columns is selected, said second voltage being different from said first voltage, and in each of said plurality of magnetic memory cells said access element is electrically connected between said magneto-resistance element and that one of said plurality of global select lines which corresponds to the corresponding column.

13. A magnetic random access memory device comprising:

a plurality of magnetic memory cells arranged in rows and columns;

a plurality of data lines arranged to correspond to said columns of said plurality of magnetic memory cells;

a plurality of data line select lines provided to correspond to said columns; and a plurality of row select lines provided to correspond to said rows of said plurality of magnetic memory cells, said plurality of magnetic memory cells each having a magneto-resistance element electrically connected to a corresponding one of said bit lines, and an access element electrically connected between said magneto-resistance element and one of said plurality of data line select lines, said access element in said data read operation turning on or off in response to a result of selecting a corresponding one of said rows, said access element in said data write operation being turned off regardless of said result.

14. The magnetic random access memory device according to claim 13, wherein:

said plurality of data line select lines are each set to a different voltage in accordance with selection and non-selection of a corresponding one of said columns;

said plurality of rows select lines are each set to a different voltage in accordance with selection and non-selection of a corresponding one of said rows; and in a corresponding one of said plurality of magnetic memory cells said data line select line connected to said access element and a corresponding one of said row select lines are set to different voltages, respectively.

15. The magnetic random access memory device according to claim 13, wherein said access element is a field effect transistor having a gate connected to a corresponding one of said row select lines.

16. The magnetic random access memory device according to claim 13, wherein each of said data line select lines having been precharged to attain a first voltage is set to attain a second voltage in each of said data read and write operations when a corresponding one of said columns is selected, said second voltage being different from said first voltage, and in each of said plurality of magnetic memory cells said access element is electrically connected between said magneto-resistance element and that one of said plurality of data line select lines which corresponds to one of said columns excluding the corresponding column.

17. A resistive memory device comprising:

a memory cell array including a plurality of memory cells arranged in rows and columns, said memory cell array being divided into a plurality of subarrays arranged in rows and columns; and a plurality of global select lines provided to correspond to one of the rows and the columns of said plurality of memory cells commonly for said subarrays sharing said one of the rows and the columns of said plurality of memory cells, said plurality of global select lines in each of data read and write operations each being set to a voltage corresponding to selection and non-selection of said one corresponding thereto, said plurality of subarrays each including a plurality of bit lines provided to correspond to said plurality of magnetic columns, a plurality of select lines provided to correspond to said one of the rows and the columns of said plurality of magnetic memory cells for selecting said one of the rows and the columns of said plurality of magnetic memory cells in said subarray corresponding thereto, and a plurality of select line drivers provided to correspond to said plurality of select lines, respectively, to each drive a voltage of a corresponding one of said select lines in response to said voltage of a corresponding one of said global select lines, said plurality of memory cells each having a resistive memory element electrically connected to a corresponding one of said bit lines, and an access element electrically connected between said resistive memory element and one of said plurality of global select lines, said access element in said data read operation turning on or off in response to a result of a row select operation in a corresponding one of said subarrays, said access element in said data write operation being turned off regardless of said result.

18. The resistive memory device according to claim 17, wherein said resistive memory device is a magnetic random access memory device, and each of said plurality of memory cells is a magnet-resistance memory.

19. A resistive memory device comprising:

a plurality of memory cells arranged in rows and columns;

a plurality of data lines arranged to correspond to said columns of said plurality of magnetic memory cells;

a plurality of data line select lines provided to correspond to said columns; and a plurality of row select lines provided to correspond to said rows of said plurality of memory cells, said plurality of memory cells each having a resistive memory element electrically connected to a corresponding one of said bit lines, and an access element electrically connected between said resistive memory element and one of said plurality of data line select lines, said access element in said data read operation turning on or off in response to a result of selecting a corresponding one of said rows, said access element in said data write operation being turned off regardless of said result.

20. The resistive memory device according to claim 19, wherein said resistive memory device is a magnetic random access memory device, and each of said plurality of memory cells is a magnet-resistance memory.

* * * * *